US009759945B2

(12) United States Patent
Ishiguro et al.

(10) Patent No.: US 9,759,945 B2
(45) Date of Patent: Sep. 12, 2017

(54) CIRCULAR POLARIZING PLATE HAVING PATTERNED RETARDATION LAYER AND ORGANIC EL DISPLAY ELEMENT HAVING SAID CIRCULAR POLARIZING PLATE

(71) Applicant: FUJIFILM Corporation, Tokyo (JP)

(72) Inventors: Makoto Ishiguro, Kanagawa (JP); Yoji Ito, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 513 days.

(21) Appl. No.: 14/477,183

(22) Filed: Sep. 4, 2014

(65) Prior Publication Data

US 2014/0375927 A1    Dec. 25, 2014

Related U.S. Application Data

(63) Continuation of application No. PCT/JP2013/055980, filed on Mar. 5, 2013.

(30) Foreign Application Priority Data

Mar. 5, 2012  (JP) ................................ 2012-048404

(51) Int. Cl.
*G02F 1/1335*  (2006.01)
*G02B 5/30*  (2006.01)
*H01L 51/52*  (2006.01)
*G02F 1/13363*  (2006.01)

(52) U.S. Cl.
CPC ..... *G02F 1/133528* (2013.01); *G02B 5/3083* (2013.01); *G02F 1/13363* (2013.01);
(Continued)

(58) Field of Classification Search
CPC .............. G02B 27/2214; G02B 5/3083; H04N 13/0404; G02F 1/133528; G02F 1/133602;
(Continued)

(56) References Cited

U.S. PATENT DOCUMENTS

2006/0024854 A1    2/2006  Kawamoto
2010/0165275 A1*   7/2010  Tsukamoto .......... G02B 5/3083
                                               349/117

FOREIGN PATENT DOCUMENTS

JP    07-142170 A    6/1995
JP    08-334619 A    12/1996
(Continued)

OTHER PUBLICATIONS

International Search Report issued in PCT/JP20131055980 dated Jun. 11, 2013.
(Continued)

*Primary Examiner* — Nathanael R Briggs
*Assistant Examiner* — William Peterson
(74) *Attorney, Agent, or Firm* — Edwards Neils LLC; Jean C. Edwards, Esq.

(57) ABSTRACT

An image display device in which an image display panel, at least one patterned retardation layer and a polarization element layer are arranged in this order, and the patterned retardation layer includes first retardation regions and second retardation regions which are alternately arranged in a stripe-like form and in which at least one of an in-plane slow axis direction and a retardation is different from each other.

16 Claims, 2 Drawing Sheets

(52) U.S. Cl.
CPC .... *G02F 1/133602* (2013.01); *H01L 51/5281*
(2013.01); *G02F 2001/133541* (2013.01);
*G02F 2001/133638* (2013.01)

(58) Field of Classification Search
CPC ..... G02F 1/13363; G02F 2001/133541; G02F
2001/133638; H01L 51/5281
USPC .......................................................... 349/15
See application file for complete search history.

(56) References Cited

FOREIGN PATENT DOCUMENTS

| | | |
|---|---|---|
| JP | 09-127885 A | 5/1997 |
| JP | 2002-098833 A | 4/2002 |
| JP | 2003-332068 A | 11/2003 |
| JP | 2006-072298 A | 3/2006 |
| JP | 4630884 B | 11/2010 |
| JP | 2011-059611 A | 3/2011 |
| JP | 2012-042530 A | 3/2012 |
| WO | 2008/152756 A1 | 12/2008 |
| WO | 2011/030882 A1 | 3/2011 |

OTHER PUBLICATIONS

Written Opinion issued in PCT/JP2013/055980 dated Jun. 11, 2013.
Notice of Reasons for Rejection Issued by the Japanese Patent Office (JPO) dated Mar. 17, 2015 in connection with Japanese Patent Application No. 2012-048404.

\* cited by examiner

CIRCULAR POLARIZING PLATE HAVING PATTERNED RETARDATION LAYER AND ORGANIC EL DISPLAY ELEMENT HAVING SAID CIRCULAR POLARIZING PLATE

CROSS REFERENCE TO RELATED APPLICATION

This is a continuation of International Application No. PCT/JP2013/055980 filed on Mar. 5, 2013, which was published under PCT Article 21(2) in Japanese, and claims priority from Japanese Patent Application No. 2012-048404 filed on Mar. 5, 2012, the entire disclosures of which are incorporated herein by reference in their entirety.

TECHNICAL FIELD

The present invention relates to a circular polarizing plate having a patterned retardation layer, and an organic electroluminescence (hereinafter, referred to as "EL") display element having the circular polarizing plate.

BACKGROUND ART

The organic electroluminescence (organic EL) display device is a thin display device of self-emission type, and has an advantage of display performance, for example, high visibility or a small viewing angle dependency, in comparison with a liquid crystal display device. Also, in addition to an advantage in that the display can be made lighter and thinner, it has a possibility of achieving a display device having a shape, which has not been realized, by using a flexible substrate.

The organic EL display device has the excellent features as described above. However, since layers having different refractive indexes are stacked using a transparent conductive material having a high refractive index, for example, ITO as an electrode and a metal material having a high reflectance are used, external light is reflected at the interface thereof, thereby causing a problem of reduction of contrast or background reflections due to internal reflection.

In order to inhibit the harmful influence due to the external light reflection, proposals of using an absorption type linear polarizing plate and a circular polarizing plate composed of a λ/4 plate have been made (for example, Patent Documents 1, 2, 3 and 4).

PRIOR ART DOCUMENT

Patent Document

Patent Document 1: JP-A-7-142170 (the term "JP-A" as used herein means an "unexamined published Japanese patent application")
Patent Document 2: JP-A-9-127885
Patent Document 3: JP-A-2003-332068
Patent Document 4: JP-A-2002-98833
Patent Document 5: Japanese Patent No. 4630884
Patent Document 6: JP-A-2011-59611

DISCLOSURE OF THE INVENTION

Problems that the Invention is to Solve

A typical constitution of the organic EL element is shown in FIG. 1. As shown in FIG. 1, the organic EL display device basically has a constitution in which on a TFT substrate 1, a back electrode 2, an organic layer 3 composed of two or three layers including a light emitting layer, a transparent electrode or translucent electrode 4 and a transparent substrate 5 are stacked, and a positive hole injected from the back electrode 2 and an electron injected from the transparent electrode 4 are recombined in the organic layer 3 to excite a fluorescent substance or the like, thereby emitting light. The light emitted from the organic layer 3 is emitted through the transparent substrate 5 directly or after being reflected with the back electrode 2 formed from aluminum or the like. Organic EL elements of various constitutions have been proposed. For example, a constitution in which the organic layer 3 has a constitution in which pixels of four colors in total composed of a white pixel in addition to a constitution in which three color pixels of red, green and blue are arranged in a matrix are arranged (for example, Patent Document 5), and a constitution in which the organic layer 3 is composed of an element emitting white light and is combined with a color filter to achieve a color display (for example, Patent Document 6) are exemplified. As described above, since the organic EL element has such a structure that plural layers having different refractive indexes are stacked and a metal electrode is used, external light is reflected at the interfaces of the respective layers to cause the problem of reduction of contrast or background reflections.

In order to inhibit the harmful influence due to the external light reflection, proposals of using an absorption type linear polarizing plate and a circular polarizing plate composed of a λ/4 plate have been made. The λ/4 plate has a large number of uses and it has already used in a reflective type LCD, a semi-transmissive type LCD, a brightness enhancement film, a pick-up for optical disc and a PS conversion element. Most of the λ/4 plates currently used are retardation plates which exhibit optical anisotropy by stretching a polymer film. The slow axis direction of the polymer film ordinarily corresponds to a vertical direction or a horizontal direction of sheet-shaped or roll-shaped film, and thus it is extremely difficult to produce a polymer film having the slow axis in an oblique direction of the sheet or roll in some cases. Inmost cases of using a λ/4 plate or λ/2 plate, the slow axis of the λ/4 plate or λ/2 plate is arranged at an angle which is neither parallel nor orthogonal to the transmission axis of the polarizing plate. Further, the slow axes of two or more sheets of λ/4 plates or λ/2 plates and the transmission axis of the polarizing plate are arranged at an angle which is neither parallel nor orthogonal to the absorption axis of the polarizing plate, respectively, in many cases. On the other hand, even when the external light reflection is reduced by using an absorption type linear polarizing plate and a circular polarizing plate composed of a λ/4 plate, coloration due to slight reflected light is visually recognized. For the reduction of external light reflection, it is preferred that Re(λ) of the λ/4 plate has reverse wavelength dispersibility, however, even when the Re(λ) of the λ/4 plate has the reverse wavelength dispersibility, the coloration due to reflected light cannot be eliminated.

Therefore, an object of the present invention is to provide an organic EL element having a circular polarizing plate, which is improved in the coloration of reflected light.

Means for Solving the Problems

The means for solving the problems are as follows.
(1) An image display device in which an image display panel, at least one patterned retardation layer and a polarization element layer are arranged in this order, and the patterned retardation layer comprises first retardation regions and second retardation regions which are alternately arranged in a stripe-like form and in which at least one of an in-plane slow axis direction and a retardation is different from each other.

(2) The image display device as described in (1), wherein at least one of the first retardation region and the second retardation region of the patterned retardation layer has an in-plane retardation of λ/4.

(3) The image display device as described in (1) or (2), wherein the first retardation region and the second retardation region of the patterned retardation layer satisfy formula (I) shown below:

$$Re(450)>Re(550)>Re(630) \qquad (I)$$

wherein Re(λ) represents an in-plane retardation (nm) at a wavelength of λ nm.

(4) The image display device as described in any one of (1) to (3), wherein the patterned retardation layer comprises an optically anisotropic layer containing at least an oriented film and a liquid crystal compound.

(5) The image display device as described in anyone of (1) to (4), wherein a total Rth of entire layers (excluding the polarization element layer) at a side, in which the patterned retardation layer is provided, of the polarization element layer in the first retardation region and the second retardation region of the patterned retardation layer satisfies formula (II) shown below:

$$-90 \text{ nm} \leq Rth(550) \leq 90 \text{ nm} \qquad (II)$$

wherein Rth(λ) represents a retardation (nm) in a thickness direction at a wavelength of λ nm.

(6) The image display device as described in (4) or (5), wherein the liquid crystal compound contained in the optically anisotropic layer is a discotic liquid crystal compound, and the discotic liquid crystal compound is oriented approximately vertically.

(7) The image display device as described in any one of (1) to (6), wherein the image display panel is an organic EL element.

Advantage of the Invention

According to the invention, an organic EL display device which is improved in the coloration of reflection image due to internal reflection of the organic EL element and which has high productivity and high durability can be provided.

MODE FOR CARRYING OUT THE INVENTION

Figure 1:
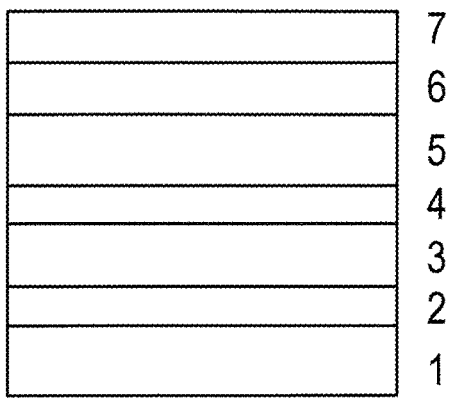
FIG. 1 is a schematic drawing of an organic EL light emitting display device.

The invention will be described in detail below. In the specification, the description of "A to B" represents the meaning of "A or more and B or less". Also, "organic EL" means organic electroluminescence.

In the specification, "visible light" is referred to light of 380 to 780 nm. Also, in the case where the measurement wavelength is not particularly noted, the measurement wavelength is 550 nm.

Further, in the specification, an angle (angle, for example, "90°") and the relationship therebetween (for example, "orthogonal", "parallel" or "intersect at 45°") are considered to include a range of error which is acceptable in the technical field to which the invention belongs. For example, an angle is within a range of less than ±10° of a strict angle, and the error from the strict angle is preferably 5° or less and more preferably 3° or less.

As to the angle, "+" indicates a clockwise direction and "−" indicates a counter-clockwise direction.

The "slow axis" means a direction in which the refractive index is the largest. Unless otherwise specifically indicated, the measurement wavelength of the refractive index is in a visible light region (λ=550 nm).

In the specification, the term "polarizing plate", unless otherwise specifically indicated, means a long polarizing plate as well as a polarizing plate cut to a size incorporated into the display device. The term "cut" as used herein includes, for example, "punch" and "clip". In the specification, the terms "polarizing film" and "polarizing plate" are discriminated from each other, and the "polarizing plate" means a stack having a transparent protective layer on at least one surface of the "polarizing film" for protecting the polarizing film.

In the specification, the term "molecular symmetry axis" indicates a rotational symmetry axis when a molecule has the rotational symmetry axis, but it is not required in a strict sense that the molecule is rotationally symmetric. In general, in the discotic liquid crystal compound, the molecular symmetry axis is matched to an axis which penetrates a center of discotic face and is vertical to the discotic face. In a rod-like liquid crystal compound, the molecular symmetry axis is matched to a major axis of the molecule.

In the specification, Re(λ) and Rth(λ) represent in-plane retardation and retardation in a thickness direction at a wavelength λ, respectively. The Re(λ) is measured by making light having a wavelength λ nm incident in a normal direction of the film using KOBRA 21ADH or WR (produced by Oji Scientific Instruments). In the selection of the measurement wavelength λ nm, the measurement may be conducted according to manual exchange of a wavelength selective filter or according to conversion of a measurement value by a program or the like. In the case where the film to be measured is expressed by a uniaxial or biaxial refractive index ellipsoid, the Rth(λ) is calculated in the manner described below.

Six Re(λ) values are measured such that light having a wavelength λ nm is made incident to the film from six directions inclined to 50° on one side at intervals of 10° to the film normal direction using an in-plane slow axis (decided by KOBRA 21ADH or WR) as an inclination axis (rotation axis) (in the case where the film has no slow axis, an arbitrary in-plane direction of film is used as the rotation axis), and the Rth(λ) is calculated by KOBRA 21ADH or WR based on the six Re(λ) values measured, a hypothetical value of the average refractive index and a thickness value of the film inputted. In the above, in the case of film having a direction in which the retardation value measured using the in-plane slow axis as the rotation axis is zero at a certain inclination angle to the normal direction, the sign of a retardation value at the inclination angle larger than the inclination angle to give a zero retardation is changed to a negative sign, and then the negative retardation value is used in the calculation by KOBRA 21ADH or WR. The Rth value can also calculated according to formula (A) and formula (III) shown below based on two retardation values measured in arbitrary two inclined directions using the slow axis as the inclination axis (rotation axis) (in the case where the film has no slow axis, an arbitrary in-plane direction is used as the rotation axis), a hypothetical value of the average refractive index, and a thickness value of the film inputted.

$$Re(\theta) = \left[nx - \frac{ny \times nz}{\sqrt{\left(ny\ \sin\left(\sin^{-1}\left(\frac{\sin(-\theta)}{nx}\right)\right)\right)^2 + \left(nz\ \cos\left(\sin^{-1}\left(\frac{\sin(-\theta)}{nx}\right)\right)\right)^2}}\right] \times \frac{d}{\cos\left(\sin^{-1}\left(\frac{\sin(-\theta)}{nx}\right)\right)}$$

Formula (A)

In the formulae above, $Re(\theta)$ represents a retardation value in the direction inclined at an angle $\theta$ to a normal direction, nx represents a refractive index in a slow axis direction in the plane, ny represents a refractive index in a direction orthogonal to nx in the plane, nz represents a refractive index in the direction orthogonal to nx and ny. d represents a film thickness.

$Rth=((nx+ny)/2-nz) \times d$     Formula (III)

In the case where the film to be measured cannot be expressed by a uniaxial or biaxial index ellipsoid, specifically, in the case where the film to be measured has no so-called optical axis (optic axis), Rth ($\lambda$) is calculated in the manner described below. Eleven $Re(\lambda)$ values are measured such that light having a wavelength $\lambda$ nm is made incident to the film from eleven directions inclined from $-50°$ to $+50°$ at intervals of $10°$ to the film normal direction using an in-plane slow axis (decided by KOBRA 21ADH or WR), as an inclination axis (rotation axis), and the Rth($\lambda$) is calculated by KOBRA 21ADH or WR based on the eleven $Re(\lambda)$ values measured, a hypothetical value of the average refractive index and a thickness value of the film inputted. In the measurement described above, as the hypothetical value of the average refractive index, values described in *Polymer Handbook* (JOHN WILEY & SONS, INC.) and catalogs of various optical films can be used. In the case where a value of average refractive index is unknown, the value can be measured by an Abbe refractometer. The average refractive indexes of major optical films are shown below: cellulose acylate (1.48), cycloolefin polymer (1.52), polycarbonate (1.59), polymethyl methacrylate (1.49), and polystyrene (1.59). By inputting the hypothetical value of the average refractive index and the film thickness, nx, ny and nz are calculated by KOBRA 21ADH or KOBRA WR. On the basis of the nx, ny and nz thus-calculated, Nz=(nx-nz)/(nx-ny) is further calculated.

Hereinafter, various materials utilized for the production of patterned retardation layer and circular polarizing plate which are used in the invention, the production methods and the like are described in detail. In the specification, the optical film has the same meaning as the optically anisotropic layer.

[Patterned Retardation Layer]

Figure 2:
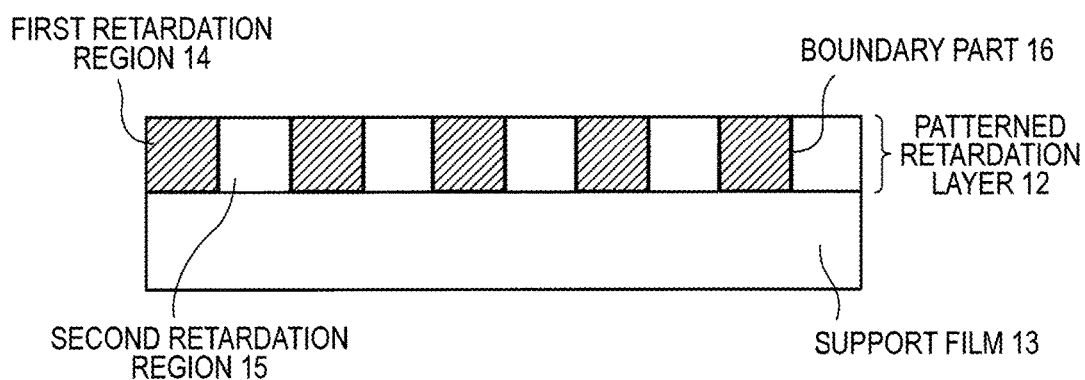
FIG. 2 is a schematic cross-sectional view of an example of a patterned retardation layer according to the invention.

The patterned retardation layer for use in the invention comprises first retardation regions and second retardation regions which are alternately arranged in a stripe-like form and in which at least one of an in-plane slow axis direction and a retardation is different from each other. In the case where the patterned retardation layer is combined with a polarizing plate to use as an external light reflection prevention layer, although the colorations of reflected light occurred in the respective regions are different because angles formed by the slow axes of the two retardation regions in the patterned retardation layer and a polarizing axis of the polarizing plate are different from each other, the coloration of reflected light is able to be greatly reduced by controlling the reflected light in the two regions. A schematic cross-sectional view of an example of the patterned retardation layer according to the invention is shown in FIG. 2. In FIG. 2, on a support film 13 is formed a patterned retardation layer 12 having a first retardation region 14, a second retardation region 15, and a boundary part 16 between the first retardation region 14 and the second retardation region 15. Description of a (light) oriented film ordinarily used for controlling orientation of the patterned retardation layer is omitted in FIG. 2.

Heretofore, it has been investigated that a retardation layer having only one retardation region of $\lambda/4$ is used in combination with a polarizing plate for the external light reflection prevention layer. However, in the case where the retardation layer having only one retardation region of $\lambda/4$ is used in combination with a polarizing plate as the external light reflection prevention layer, the reflected light is colored depending on retardation of the retardation layer and an angle formed by the slow axis of the retardation region in the retardation layer and a polarizing axis of the polarizing plate. In order to reduce the coloration of external light reflection, it is preferred that $Re(\lambda)$ of the retardation layer has reverse wavelength dispersibility, however, it is difficult to provide the reverse wavelength dispersibility of $Re(\lambda)$ sufficient for reducing the coloration to a conventional $\lambda/4$ plate. Specifically, the coloration of external light reflection cannot be eliminated by a conventional retardation layer having only one retardation region of $\lambda/4$. On the contrary, by using the patterned retardation layer in combination with the polarizing plate as the external light reflection prevention layer, since the colorations of reflected light occurred in the two retardation regions in the patterned retardation layer are different, the coloration of reflected light is able to be greatly reduced by controlling the reflected light in the two regions.

On the boundary part 16 may further be provided a light shielding part. The light shielding part just has a function of at least reducing light transmittance, and preferably has a function of completely shielding light. One example thereof is a black color layer.

Figure 3:
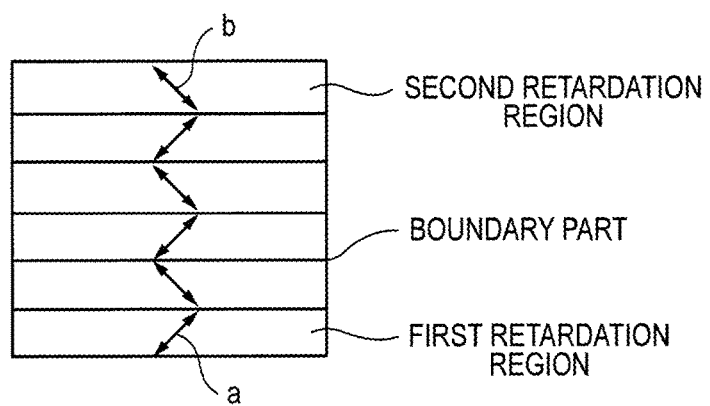
FIG. 3 is a top schematic view of an example of a patterned optically anisotropic layer.

In the patterned retardation layer for use in the invention, at least any one of the first retardation region and the second retardation region preferably has an in-plane retardation of $\lambda/4$. Re (550) of the region having the in-plane retardation of $\lambda/4$ is preferably from 110 to 160 nm, more preferably from 115 to 155 nm, and still more preferably from 120 to 150 nm. It is preferred because the reflected light can be reduced to an extent that it is not noticeable and practically acceptable. One example of the patterned retardation layer 12 is, as shown in FIG. 3, a pattern λ/4 layer in which an in-plane slow axis a and an in-plane slow axis b of the first retardation region 14 and the second retardation region 15 are orthogonal to each other and the in-plane retardation Re is λ/4. When the patterned retardation layer of such an embodiment is combined with a polarizing film, lights transmitted through the first and second retardation regions form circular polarization states of opposite directions, respectively.

In the invention, the patterned retardation layer should not be construed as being limited to the embodiment shown in FIG. 3. A display pixel region wherein an in-plane retardation of one of the first and second retardation regions is λ/4 and an in-plane retardation of the other of the first and second retardation regions is 3λ/4 can be utilized. Further, a retardation region wherein an in-plane retardation of one of the first and second retardation regions 14 and 15 is λ/2 and an in-plane retardation of the other of the first and second retardation regions is 0 can also be utilized.

The Re wavelength dispersion of the patterned retardation layer for use in the invention preferably satisfies formula (I) shown below:

$$Re(450) > Re(550) > Re(630) \qquad (I)$$

wherein $Re(\lambda)$ represents an in-plane retardation (nm) at a wavelength of λ nm.

As described above, the coloration of reflected light can be reduced by controlling the reflected light occurred in the two regions of the patterned retardation layer. Although the reflected light is able to be controlled by the Re or slow axis of each region of the patterned retardation layer, in consideration of the robustness of the Re and slow axis at the time of production, it is preferred that the reflected color change is small when the Re or slow axis is slightly changed in the individual region. Specifically, the Re of the patterned retardation layer preferably has a normal dispersion, and it preferably satisfies $1.03 \leq Re(450)/Re(550) \leq 1.30$, more preferably satisfies $1.04 \leq Re(450)/Re(550) \leq 1.25$, and still more preferably satisfies $1.05 \leq Re(450)/Re(550) \leq 1.20$. The range described above is preferred because the coloration change of the reflected light can be reduced to an extent that it is not visually recognized, even when the Re is changed approximately 10 nm or the slow axis is changed approximately 5 degrees.

The patterned retardation layer 12 can be formed from one kind or plural kinds of curable compositions containing a liquid crystal compound as the main component. Of the liquid crystal compounds, a liquid crystal compound having a polymerizable group is preferred. It is preferred to be formed from one kind of the curable compositions described above. The patterned retardation layer 12 may be a single layer structure or a stack structure of two or more layers, and is preferably the single layer structure from the standpoint of productivity. The patterned retardation layer can be formed from one kind or plural kinds of curable compositions containing a liquid crystal compound as the main component.

The patterned retardation layer can be formed, for example, by uniformly forming an oriented film on a surface of the support film 13, conducting an orientation treatment in one direction, being oriented the liquid crystalline curable composition on the orientation treatment surface, and fixing the orientation state. In an embodiment where the liquid crystalline curable composition contains a discotic liquid crystal compound as the main component, as to one of the first and second retardation regions 14 and 15, the liquid crystals are oriented orthogonal and vertical to the orientation control treatment direction (for example, a rubbing direction), that is, subjected to an orthogonal and vertical orientation, and as to the other of the first and second retardation regions 14 and 15, the liquid crystals are oriented parallel and vertical to the orientation control treatment direction (for example, a rubbing direction), that is, subjected to a parallel and vertical orientation, and the respective states are fixed to form the respective retardation regions.

The in-plane slow axes of respective patterns in the first and second retardation regions can be controlled to be in directions different from each other, for example, orthogonal to each other by using, for example, a patterned oriented film. As the patterned oriented film, any of a light-oriented film capable of forming a patterned oriented film through mask exposure, a rubbing-oriented film capable of forming a patterning oriented film by mask rubbing, and a film in which different oriented films (for example, materials which are oriented orthogonal or parallel to rubbing) are arranged in pattern by printing or the like can be utilized. In the case where the respective in-plane slow axes in the first and second retardation regions are orthogonal to each other, the in-plane slow axis of the boundary part is preferably an approximately intermediate value between the in-plane slow axis directions in the first and second retardation regions, that is, about 45 degrees.

The total Rth of entire layers (excluding the polarization element layer) provided at a side, in which the patterned retardation layer is provided, of the polarization element layer in the first retardation region and the second retardation region of the patterned retardation layer for use in the invention satisfies formula (II) shown below:

$$-90 \text{ nm} \leq Rth(550) \leq 90 \text{ nm} \qquad (II)$$

wherein $Rth(\lambda)$ represents a retardation (nm) in a thickness direction at a wavelength of λ nm.

The retardation in a thickness direction Rth (550) is preferably from −60 to 60 nm, and more preferably from −40 to 40 nm. In the range described above, tint difference of the reflected lights between in the front and an oblique direction can be more reduced.

The width of the boundary part between the first and second retardation regions is preferably from 0 to 20 μm, more preferably from 0 to 10 μm, and particularly preferably from 0 to 3 μm.

The patterned retardation layer according to the invention should not be construed as being limited to the embodiments simplistically shown in FIG. 2 and FIG. 3, and may include other members. For example, in the embodiment where the patterned retardation layer is formed by utilizing the oriented film as described above, the oriented film may be provided between the support and the patterned retardation layer. Further, the patterned retardation layer according to the invention may be provided with a front scattering layer, a primer layer, an antistatic layer, an undercoat layer or the like in addition to (or in place of) a hardcoat layer, an antireflection layer, a low-reflection layer, an antiglare layer or the like.

The present invention also relates to a circular polarizing plate. The circular polarizing plate according to the invention has at least a polarizing film and a patterned retardation layer. In an embodiment where the circular polarizing plate has a polarizing film, a patterned retardation layer and a support film, the support film is preferably arranged between the patterned retardation layer and the polarizing film.

Figure 4:
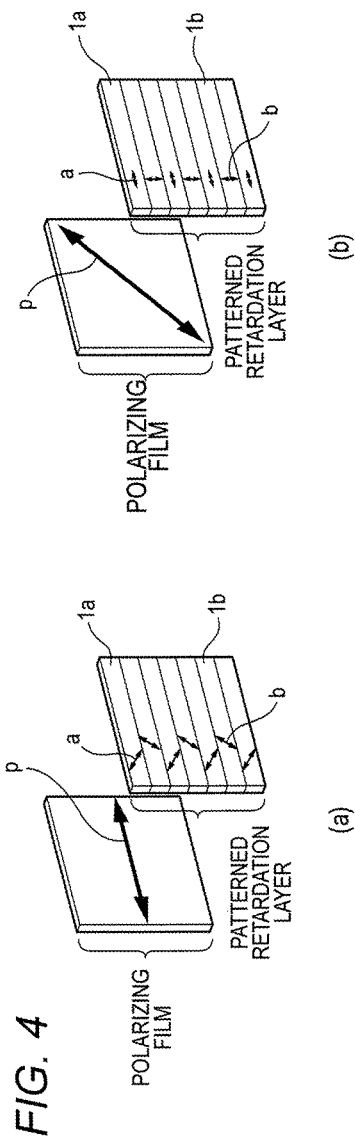
FIG. 4 is an outline view of an example of relationship between a polarizing film and an optically anisotropic layer.

In the circular polarizing plate according to the invention, in-plane slow axes a and b in the first and second retardation regions 14 and 15 are arranged at ±45° to a transmission axis p of the polarizing film, respectively, as shown in FIG. 4 as an example. In the specification, it is not requested to be strictly ±45°, and a range from 40 to 50° in any one of the first and second retardation regions 14 and 15 is preferred and a range from −50 to −40° in the other of the first and second retardation regions 14 and 15 is preferred.

The polarizing plate for use in the invention has a protective film and a polarizing film. As the polarizing film, any of an iodine type polarizing film, a dye type polarizing film using a dichroic dye and a polyene type polarizing film may be used. The iodine type polarizing film and dye type polarizing film are ordinarily produced using a polyvinyl alcohol film. The absorption axis of the polarizing film corresponds to a stretching direction of the film. Thus, the polarizing film stretched in a longitudinal direction (transporting direction) has an absorption axis parallel to the longitudinal direction of the polarizing film, and the polarizing film stretched in a transverse direction (direction vertical to the transporting direction) has the absorption axis vertical to the longitudinal direction of the polarizing film.

The polarizing film ordinarily has a protective film. In the invention, the optical stack described above may function as a protective film for the polarizing film. In the case where a protective film for the polarizing film is stacked apart from the optical stack, a cellulose ester film having high optical isotropy is preferably used as the protective film.

A preferred method for producing the polarizing plate for use in the invention includes a process of continuously stacking the optical stack and the polarizing film respectively in a long state. The long polarizing plate is cut to fit the size of a screen of the image display device used.

A linear polarizing film as the polarizing film may be used in combination with the optical stack to produce a polarizing film-integrated optical film, which functions as a circular polarizing plate or an elliptical polarizing plate, with high productivity.

Further, the present invention also relates to an image display device having at least the circular polarizing plate and a display panel driven based on an image signal. The deterioration of visibility on the image display panel due to the external reflected light can be prevented by means of the circular polarizing plate. In particular, it is preferred that the polarizing film, the patterned retardation layer and the image display panel are arranged in this order.

In the invention, there is no limitation on the display panel. For example, it may be an organic EL display panel containing an organic EL layer, a liquid crystal panel containing a liquid crystal layer or a plasma display panel. In any of the embodiments, various possible constitutions may be adopted. Also, although the liquid crystal panel or the like has a polarizing film for image display on a surface of the viewing side, the function described above may be achieved in combination with the polarizing film, as described above.

Hereinafter, various members and the like used in the patterned retardation layer for use in the invention are described in detail.

Light-Shielding Part:

The patterned retardation layer for use in the invention may have a light-shielding part. On example of the light-shielding part is a black color layer, and the black color layer is preferably a black strip layer.

Materials for forming the black strip layer include, for example, a sputtered film of metal, for example, chromium, and a light-shielding photosensitive composition containing a photosensitive resin in combination with a black coloring agent or the like. Specific examples of the black coloring agent include carbon black, titanium carbon, iron oxide, titanium oxide and graphite. Among them, carbon black is preferred.

The line width of the light-shielding part is preferably from 3 to 420 μm, more preferably from 20 to 380 μm, and particularly preferably from 40 to 350 μm.

Patterned Retardation Layer:

The patterned retardation layer according to the invention contains the first retardation region and the second retardation region in which at least one of an in-plane slow axis direction and an in-plane retardation is different from each other, the first retardation region and the second retardation region are alternately arranged in the plane, and has a boundary part between the first retardation region and the second retardation region. One example is an optically anisotropic layer in which the first retardation region and the second retardation region have Re of approximately λ/4, respectively, and the in-plane slow axes are orthogonal to each other. Various methods can be used for forming such a patterned retardation layer, and it is preferred in the invention that the patterned retardation layer is formed by polymerizing rod-like liquid crystals having a polymerizable group in a parallel orientation state or discotic liquid crystals having a polymerizable group in a vertical orientation state and fixing.

In general, the liquid crystal compounds are classified into a rod-like type and a discotic type based on the shape thereof. Further, each type includes a low-molecular type and a high-molecular type. The "high molecular type" commonly means a polymer having a degree of polymerization of 100 or more (Masao Doi, Kobunshi Butsuri • Soten-i Dynamics (Polymer Physics • Phase Transition Dynamics), page 2, Iwanami Shoten, Publishers (1992). In the invention, any liquid crystal compound can be used, and a rod-like liquid crystal compound or a discotic liquid crystal compound is preferably used. Two or more rod-like liquid crystal compounds, two or more discotic liquid crystal compounds, or a mixture of a rod-like liquid crystal compound and a discotic liquid crystal compound may be used. From the standpoint of reducing changes depending on temperature and humidity, the layer is more preferably formed using a rod-like liquid crystal compound having a reactive group or discotic liquid crystal compound having a reactive group. Still more preferably, at least one liquid crystal compound has two or more reactive groups in one liquid crystal molecule. A mixture of two or more liquid crystal compounds may be used. In such a case, at least one liquid crystal compound preferably has two or more reactive groups.

As the rod-like liquid crystal compound, for example, those described in JP-T-11-513019 (the term "JP-T" as used herein means a published Japanese translation of a PCT patent application) and JP-A-2007-279688 are preferably used. As the discotic liquid crystal compound, for example, those described in JP-A-2007-108732 and JP-A-2010-244038 are preferably used. However, the invention should not be construed as being limited to those described above.

It is also preferred that the liquid crystal compound has two or more kinds of reactive groups which have different polymerization conditions. In such a case, a retardation layer containing a polymer having unreacted reactive groups can be produced by only polymerizing a partial kind of reactive group among the plural kinds of reactive groups by selecting the polymerization conditions. The polymerization condition used may be a wavelength range of ionized radiation used for the polymerization and fixing or a polymerization mechanism. Preferably, a combination of a radical reactive group and a cationic reactive group, which is controllable with a kind of initiator used. A combination of an acryl group and/or a methacryl group as the radical reactive group and a vinyl ether group, an oxetane group and/or an epoxy group as the cationic reactive group is particularly preferred because the reactivity can be easily controlled.

The optically anisotropic layer can be formed by various methods utilizing an oriented film, and the method for production thereof is not particularly limited.

A first embodiment is a method in which a plurality of actions which affect the orientation control of liquid crystal are utilized, and then some actions are extinguished by an external stimulus (for example, heat treatment), thereby making a predetermined orientation control action dominant. For example, the liquid crystal is made to have a predetermined orientation state using a combined action of an orientation control function of an oriented film and an orientation control function of an orientation controlling agent added to the liquid crystal compound, the orientation state is fixed so as to form one anisotropy region, then, one of the actions (for example, the action of the orientation controlling agent) is extinguished by an external stimulus (for example, heat treatment), the other orientation control action (the action of the oriented film) is made to be dominant so as to realize another orientation state, and the orientation state is fixed to form the other anisotropy region. For example, a predetermined pyridinium compound or a predetermined imidazolium compound is eccentrically located on a surface of the hydrophilic polyvinyl alcohol oriented film because the pyridinium group or the imidazolium group is hydrophilic. Particularly, when the pyridinium group is further substituted with an amino group, which is a substituent of an acceptor of a hydrogen atom, an intermolecular hydrogen bond is generated between the compound and the polyvinyl alcohol so that the compound is eccentrically located on the surface of the oriented film in high density, and the pyridinium derivative is oriented in an orthogonal direction to the main chain of the polyvinyl alcohol due to the effect of the hydrogen bond, thereby promoting the orthogonal orientation of liquid crystal with respect to a rubbing direction. Since the pyridinium derivative has a plurality of aromatic rings in the molecule, a strong intermolecular n-n interaction is caused between the pyridinium derivative and the liquid crystal, particularly, the discotic liquid crystal compound, and an orthogonal orientation of the discotic liquid crystal is induced in the vicinity of the interface with the oriented film. In particular, when a hydrophobic aromatic ring is connected to a hydrophilic pyridinium group, the hydrophobic effect also results in an effect of inducing the vertical orientation. However, when the optically anisotropic layer is heated to higher than a certain temperature, the hydrogen bond is broken, the density of the pyridinium compound or the like on the surface of the oriented film is reduced so that the action thereof is extinguished. As a result, the liquid crystal is oriented by the restraining force of the rubbing oriented film itself, and the liquid crystal is made to have a parallel orientation state. The method is described in detail in Japanese Patent Application No. 2010-141346, and the contents thereof are incorporated herein by reference.

A second embodiment is an embodiment utilizing a patterned oriented film. According to the embodiment, patterned oriented films having different orientation controlling functions from each other are formed, a liquid crystal compound is arranged on the patterned oriented films, and the liquid crystal is oriented. The orientation of the liquid crystal is regulated by the respective orientation controlling functions of the patterned orientation films, and the different orientation states from each other are achieved. When the respective orientation states are fixed, the patterns of the first and second retardation regions are formed depending on the patterns of the oriented films. The patterned oriented films can be formed, for example, by utilizing a printing method, mask rubbing to a rubbing oriented film or mask exposure to a photo-oriented film. The patterned oriented film can also be formed by uniformly forming an oriented film, and separately printing an additive (for example, the onium salt described above) which affects the orientation controlling function in a predetermined pattern. A method in which a printing method is used is preferred because a large facility is not required and the production is easy. The method is described in detail in Japanese Patent Application No. 2010-173077, and the contents thereof are incorporated herein by reference.

In addition, the first and second embodiments may be used together. An example is that a photo acid generating agent is added to the oriented film. According to the example, the photo acid generating agent is added to the oriented film, the photo acid generating agent is decomposed by pattern exposure so as to form a region in which an acidic compound is generated and a region in which an acidic compound is not generated. In the portion in which light is not irradiated, the photo acid generating agent is seldom decomposed, the interaction between the oriented film material, the liquid crystal, and an orientation controlling agent optionally added dominates the orientation state, and the liquid crystal is oriented in a direction in which the slow axis is orthogonal to the rubbing direction. When light is irradiated to the oriented film, and an acidic compound is generated, the interaction loses the dominancy, the rubbing direction of the rubbing oriented film dominates the orientation state, and the liquid crystal is oriented in parallel in which the slow axis of liquid crystal is in parallel to the rubbing direction. A water-soluble compound is preferably used as the photo acid generating agent for use for in the oriented film. Examples of the photo acid generating agents usable include compounds described in *Prog. Polym. Sci.*, Vol 23, page 1485 (1998). A pyridinium salt, an iodonium salt and a sulfonium salt are particularly preferably used as the photo acid generating agent. The method is described in detail in Japanese Patent Application No. 2010-289360, and the contents thereof are incorporated herein by reference.

Moreover, as a third embodiment, there is a method in which a discotic liquid crystal compound having polymerizable groups which have different polymerization properties from each other (for example, an oxetanyl group and a polymerizable ethylenically unsaturated group) is utilized. According to the embodiment, the discotic liquid crystal compound is made to have a predetermined orientation state, and then light irradiation or the like is performed under conditions in which a polymerization reaction of only one polymerizable group proceeds, thereby forming a pre-optically anisotropic layer. Then, mask exposure is performed under conditions in which the other polymerizable group can be polymerized (for example, in the presence of a polymerization initiator which initiates the polymerization of the other polymerizable group). The orientation state in the exposed area is completely fixed, and one retardation region having a predetermined Re is formed. In the unexposed area, a reaction of one reactive group proceeds, but the other reactive group remains unreacted. Therefore, when the liquid crystal compound is heated to a temperature exceeding an isotropic phase temperature at which a reaction of the other reactive group can proceed, the unexposed area is fixed in an isotropic phase state, that is, Re becomes 0 nm.

As to the support (support film) capable of being utilized in the invention, a material thereof is not particularly limited. A polymer film having a low retardation is preferably used, and, specifically, a film having an absolute value of the in-plane retardation of approximately 10 nm or less is preferably used. Even in an embodiment in which a protective film for the polarization film is arranged between the polarization film and the patterned retardation film, a polymer film having a low retardation is preferably used as the protective film, and the specific range is as described above.

Examples of the material for forming the support film which can be used in the invention include a polycarbonate polymer, a polyester polymer, for example, polyethylene terephthalate or polyethylene naphthalate, an acrylic polymer, for example, polymethyl methacrylate, and a styrene polymer, for example, polystyrene or an acrylonitrile styrene copolymer (AS resin). Also, a polyolefin, for example, polyethylene or polypropylene, a polyolefin polymer, for example, an ethylene propylene copolymer, a vinyl chloride polymer, an amide polymer, for example, nylon or an aromatic polyamide, an imide polymer, a sulfone polymer, a polyether sulfone polymer, a polyether ether ketone polymer, a polyphenylene sulfide polymer, a vinylidene chloride polymer, a vinyl alcohol polymer, a vinyl butyral polymer, an arylate polymer, a polyoxymethylene polymer, an epoxy polymer, and a mixture of the polymers described above. Further, the polymer film according to the invention can be formed as a cured layer of an acryl, urethane, acryl urethane, epoxy or silicone ultraviolet curable or thermosetting resin.

A thermoplastic norbornene resin can be preferably used as the material for the film. The thermoplastic norbornene resin includes, for example, ZEONEX and ZEONOR produced by Zeon Corp., and ARTON produced by JSR Corp.

A cellulose polymer (hereinafter, referred to as a cellulose acylate) which has been conventionally used as a transparent protective film for polarizing plate and is represented by triacetyl cellulose can be preferably used.

A method for producing the support film is not particularly limited, and may be a solution film-forming method or a melt film-forming method. Also, a stretched film which has been subjected to a stretch treatment may be used for adjustment of retardation.

The thickness of the patterned retardation layer formed in the manner described above is not particularly limited and is preferably from 0.1 to 10 μm, and more preferably from 0.5 to 5 μm.

Polarizing Film:

As the polarizing film, a conventional polarizing film can be used. For example, a polarizer film, for example, composed of a polyvinyl alcohol film dyed with iodine or a dichroic dye can be used.

Adhesive Layer:

An adhesive layer may be provided between the optically anisotropic layer and the polarizing film. The adhesive layer used for stacking the optically anisotropic layer and the polarizing film represents, for example, a substance having a ratio of G' and G" (tan δ=G"/G') measured by a dynamic viscoelasticity measurement device of 0.001 to 1.5, and includes, for example, an adhesive or a substance liable to creep. The adhesive is not particularly limited, and, for example, a polyvinyl alcohol adhesive can be used.

Hardcoat Layer, Antireflection Layer:

The circular polarizing plate according to the invention may be provided with a single or a plurality of functional layers necessary for a surface film depending on the purpose.

Examples of a preferred embodiment include an embodiment in which a hardcoat layer is stacked on a protective film of the polarizing plate, an embodiment in which an antireflection layer is stacked on a protective film of the polarizing plate, and an embodiment in which a hardcoat layer is stacked on a protective film of the polarizing plate and an antireflection layer is further stacked thereon. The antireflection layer is a layer composed of at least one layer, which is designed in consideration of the refractive index, the film thickness, the number of layers, the order of the layers and the like so as to reduce the reflectance by optical interference.

The simplest constitution of the antireflection layer is a constitution in which only a low refractive index layer is coated on the outermost surface of the film. In order to further reduce the reflectance, a constitution in which a high refractive index layer having a high refractive index and a low refractive index layer having a low refractive index are combined to form an antireflection layer is preferred. Examples of the constitution include a two-layer constitution having a high refractive index layer/a low refractive index layer stacked sequentially from the lower side, and a constitution of three layers having different refractive indexes in which a medium refractive index layer (a layer having a refractive index which is higher than that of the lower layer and lower than that of the high refractive index layer)/a high refractive index layer/a low refractive index layer are stacked in this order. A layer constitution in which much more antireflection layers are stacked is also proposed. Among them, in view of durability, optical characteristics, cost, productivity or the like, a constitution of a medium refractive index layer/a high refractive index layer/a low refractive index layer stacked in this order on the hardcoat layer is preferred, and constitutions described, for example, in JP-A-8-122504, JP-A-8-110401, JP-A-10-300902, JP-A-2002-243906 and JP-A-2000-111706 are exemplified. Also, an antireflection film of three-layer constitution excellent in robustness against variation in layer thickness is described in JP-A-2008-262187. In the case of providing the antireflection film of three-layer constitution on a surface of image display device, an average value of reflectance can be controlled to 0.5% or less so that background reflections can be significantly reduced and images excellent in three dimensional appearance can be obtained. Further, other functions may be imparted to respective layers and, for example, a low refractive index layer having an antifouling property, a high refractive index layer having an antistatic property, a hardcoat layer having an antistatic property and a hardcoat layer having an antiglare property are exemplified (for example, JP-A-10-206603, JP-A-2002-243906 and JP-A-2007-264113).

Specific examples of the layer constitution having a hardcoat layer or an antireflection layer are shown below. In the examples shown below, -*/ represents a base material on which the functional layer is stacked. Specifically, it represents the support film, the patterned retardation layer, the polarizing film, the protective film of polarizing plate or the like.

-*/hardcoat layer
-*/low refractive index layer
-*/antiglare layer/low refractive index layer
-*/hardcoat layer/low refractive index layer
-*/hardcoat layer/antiglare layer/low refractive index layer
-*/hardcoat layer/high refractive index layer/low refractive index layer
-*/hardcoat layer/medium refractive index layer/high refractive index layer/low refractive index layer -*/hardcoat layer/antiglare layer/high refractive index layer/low refractive index layer -*/hardcoat layer/antiglare layer/medium refractive index layer/high refractive index layer/low refractive index layer -*/antiglare layer/high refractive index layer/low refractive index layer -*/antiglare layer/medium refractive index layer/high refractive index layer/low refractive index layer Of the layer constitutions, a constitution in which a functional layer, for example, a hardcoat layer, an antiglare layer or an antireflection layer is directly formed on a protective film of polarizing plate is preferred. Also, an optical film having a layer, for example, a hardcoat layer, an antiglare layer or an antireflection layer provided on a support is prepared separately and the optical film may be stacked with the circular polarizing plate to produce.

(Hardcoat Layer)

A hardcoat layer may be provided on the surface film for use in the image display device according to the invention in order to impart physical strength to the film. In the invention, the hardcoat layer may not be formed, but the formation of hardcoat layer is preferred because the scratch-resistance, for example, in a pencil scratch test or the like becomes strong.

Preferably, a low refractive index layer is provided on the hardcoat layer, and more preferably, a medium refractive index layer and a high refractive index layer are provided between the hardcoat layer and the low refractive index layer to constitute the antireflection film.

The hardcoat layer may be composed of a stack of two or more layers.

The refractive index of the hardcoat layer in the invention is preferably in a range from 1.48 to 2.00, and more preferably in a range from 1.48 to 1.70, in view of the optical design to obtain a surface film having an antireflection property.

The film thickness of the hardcoat layer is ordinarily approximately from 0.5 to 50 μm, preferably from 1 to 20 μm, and more preferably from 5 to 20 μm, from the standpoint of imparting sufficient durability and impact resistance to the surface film.

The strength of the hardcoat layer is preferably H or more, more preferably 2H or more, and most preferably 3H or more by a pencil hardness test. Further, it is preferred that an amount of abrasion of a test specimen before and after the Taber test in accordance with JIS K5400 is as small as possible.

The hardcoat layer is preferably formed by a crosslinking reaction or a polymerization reaction of an ionized radiation curable compound. The hardcoat layer may be formed, for example, by coating a coating composition containing an ionized radiation curable polyfunctional monomer or polyfunctional oligomer on a transparent support, and subjecting the polyfunctional monomer or the polyfunctional oligomer to a crosslinking reaction or a polymerization reaction. The functional group of the ionized radiation curable polyfunctional monomer or polyfunctional oligomer is preferably a photo-, electron beam- or radiation-polymerizable group, and among them, a photopolymerizable functional group is preferred. Examples of the photopolymerizable functional group include a polymerizable functional group, for example, a (meth)acryloyl group, a vinyl group, a styryl group or an allyl group, and among them, a (meth)acryloyl group or $-C(O)OCH=CH_2$ is preferred.

Specific examples of the ionized radiation curable compound include a (meth)acrylic diester of alkylene glycol, a (meth)acrylic diester of polyoxyalkylene glycol, a (meth) acrylic diester of polyhydric alcohol, a (meth)acrylic diester of an adduct of ethylene oxide or propylene oxide, an epoxy (meth)acrylate, a urethane (meth)acrylate, and a polyester (meth)acrylate.

As the polyfunctional acrylate compound having a (meth) acryloyl group, a commercially available product can also be used, and for example, NK Ester A-TMMT produced by Shin-Nakamura Chemical Co., Ltd. and KAYARAD DPHA produced by Nippon Kayaku Co., Ltd. are exemplified. The polyfunctional monomer is described in Paragraph Nos. [0114] to [0122] of JP-A-2009-98658, and the same can apply to the invention.

The ionized radiation curable compound is preferably a compound having a hydrogen bond-forming substituent from the standpoint of adhesion property to the support and low curling property. The hydrogen bond-forming substituent indicates a substituent in which an atom having a large electron negativity, for example, a nitrogen atom, an oxygen atom, a sulfur atom or a halogen atom and a hydrogen atom are connected through a covalent bond, and specifically includes OH—, SH—, —NH—, CHO— and CHN—. A urethane(meth)acrylate and a (meth)acrylate having a hydroxy group are preferred. A commercially available compound is also used, and, for example, NK Oligo U4HA and NK Ester A-TMM-3 produced by Shin-Nakamura Chemical Co., Ltd. and KAYARAD PET-30 produced by Nippon Kayaku Co., Ltd. are exemplified.

The hardcoat layer may contain a matting particle having an average particle size from 1.0 to 10.0 μm, preferably from 1.5 to 7.0 μm, for example, a particle of an inorganic compound or a resin particle, for the purpose of imparting an internal scattering property.

Various refractive index monomers or inorganic particles, or both of them may be added to the binder of the hardcoat layer for the purpose of controlling the refractive index of the hardcoat layer. The inorganic particle has an effect of suppressing the curing shrinkage caused by a crosslinking reaction, in addition to an effect of controlling the refractive index. In the invention, after formation of the hardcoat layer, a polymer produced by polymerizing the polyfunctional monomer and/or the high refractive index monomer and the like and inorganic particles dispersed therein are collectively referred to as a binder.

(Antiglare Layer)

An antiglare layer is formed for the purpose of imparting to the surface film, an antiglare property caused by surface scattering and preferably a hard coating property for improving the hardness and the scratch resistance of the surface film.

The antiglare layer is described in Paragraph Nos. [0178] to [0189] of JP-A-2009-98658, and the same can apply to the invention.

[High Refractive Index Layer and Medium Refractive Index Layer]

The refractive index of the high refractive index layer is preferably from 1.70 to 1.74, and more preferably from 1.71 to 1.73. The refractive index of the medium refractive index is adjusted so as to be a value between the refractive index of the low refractive index layer and the refractive index of the high refractive index layer. The refractive index of the medium refractive index layer is preferably from 1.60 to 1.64, and more preferably from 1.61 to 1.63.

As to a method for forming the high refractive index layer or the medium refractive index layer, it is possible to use a transparent thin film of inorganic oxide formed by a chemical vapor deposition (CVD) method or a physical vapor deposition (PVD) method, particularly, a vacuum deposition method or a sputtering method, which is a kind of the physical vapor deposition method, but a method of using all-wet coating is preferred.

Since the medium refractive index layer may be prepared in the same manner using the same materials as the high refractive index layer except that the refractive index is different from that of the high refractive index layer, the high refractive index layer will be particularly described below.

The high refractive index layer is preferably formed by coating a coating composition containing an inorganic fine particle, a curable compound having a trifunctional or higher polymerizable group (hereinafter, also referred to as a "binder" in some cases), a solvent and a polymerization initiator, drying the solvent, and then curing the coating by heating, irradiation of ionized radiation or a combination of both means. In the case of using the curable compound or the initiator, the curable compound may be cured by a polymerization reaction with heat and/or ionized radiation after coating, thereby forming a medium refractive index layer or high refractive index layer excellent in the scratch resistance and adhesion property.

(Inorganic Fine Particle)

The inorganic fine particle is preferably an inorganic fine particle containing an oxide of metal, and more preferably an inorganic fine particle containing an oxide of at least one metal selected from Ti, Zr, In, Zn, Sn, Al and Sb.

As the inorganic fine particle, a fine particle of zirconium oxide is preferred from the standpoint of refractive index. Further, it is preferred that an inorganic fine particle having an oxide of at least one metal of Sb, In and Sn as the main component is used from the standpoint of conductivity. The conductive inorganic fine particle is more preferably at least one metal oxide selected from the group consisting of tin-doped indium oxide (ITO), antimony-doped tin oxide (ATO), fluorine-doped tin oxide (FTO), phosphorus-doped tin oxide (PTO), zinc antimonate (AZO), indium-doped zinc oxide (IZO), zinc oxide, ruthenium oxide, rhenium oxide, silver oxide, nickel oxide and copper oxide.

By varying the amount of the inorganic fine particle, a refractive index may be adjusted to the predetermined refractive index. As to the average particle size of the inorganic fine particle in the layer, in the case of using zirconium oxide is as the main component, it is preferably from 1 to 120 nm, more preferably from 1 to 60 nm, and still more preferably from 2 to 40 nm. The range is preferred because the haze is suppressed and the dispersion stability and adhesion property to the upper layer due to appropriate unevenness on the surface are improved.

The refractive index of the inorganic fine particle having zirconium oxide as the main component is preferably from 1.90 to 2.80, more preferably from 2.00 to 2.40, and most preferably from 2.00 to 2.20.

The amount of the inorganic fine particle added may vary depending on the layer to be added, and in the medium refractive index layer, the amount added is preferably from 20 to 60% by weight, more preferably from 25 to 55% by weight, still more preferably from 30 to 50% by weight, based on the total solid content of the medium refractive index layer. In the high refractive index layer, the amount added is preferably from 40 to 90% by weight, more preferably from 50 to 85% by weight, still more preferably from 60 to 80% by weight, based on the total solid content of the high refractive index layer.

The particle size of the inorganic fine particle can be measured by a light-scattering method or an electron microscope photograph. The specific surface area of the inorganic fine particle is preferably from 10 to 400 $m^2/g$, more preferably from 20 to 200 $m^2/g$, and most preferably from 30 to 150 $m^2/g$.

(Curable Compound)

The curable compound is preferably a polymerizable compound, and as the polymerizable compound, an ionized radiation curable polyfunctional monomer or polyfunctional oligomer is preferably used. The functional group in the compound is preferably photo-, electron beam- or radiation-polymerizable functional group, and among them, a photopolymerizable functional group is preferred. Examples of the photopolymerizable functional group include an unsaturated polymerizable functional group, for example, a (meth)acryloyl group, a vinyl group, a styryl group or an allyl, and among them, a (meth)acryloyl group is preferred.

As specific examples the photopolymerizable polyfunctional monomer having a photopolymerizable functional group, the compounds described in the ionized radiation curable compound for use in the formation of the hardcoat layer described above may be preferably used.

In the high refractive index layer, a surfactant, an antistatic agent, a coupling agent, a thickener, a coloration inhibitor, a coloring agent (a pigment or a dye), a defoaming agent, a leveling agent, a flame retardant, an ultraviolet absorber, an infrared absorber, an adhesion-imparting agent, a polymerization inhibitor, an antioxidant, a surface modifier, a conductive metal fine particle and the like may be added, in addition to the components (the inorganic fine particle, curable compound, polymerization initiator, photosensitizer and the like) described above.

As described above, the medium refractive index layer can be obtained by using the same materials and in the same manner as those of the high refractive index layer.

[Low Refractive Index Layer]

The low refractive index layer according to the invention preferably has the refractive index from 1.30 to 1.47. The refractive index of the low refractive index layer in the case where the surface film is an antireflection film of a multilayer thin film interference type (medium refractive index layer/high refractive index layer/low refractive index layer) is preferably from 1.33 to 1.38, and more preferably from 1.35 to 1.37. The range described above is preferred because the reflectance is suppressed and the film strength can be maintained. As to a method for forming the low refractive index layer, it is also possible to use a transparent thin film of inorganic oxide formed by a chemical vapor deposition (CVD) method or a physical vapor deposition (PVD) method, particularly, a vacuum deposition method or a sputtering method, which is a kind of the physical vapor deposition method, but a method of all-wet coating using a composition for low refractive index layer is preferably used.

The low refractive index layer can be formed by using a fluorine-containing curable polymer, a fluorine-containing curable monomer, a fluorine-noncontaining curable monomer, a low refractive index particle and the like as the constituting components. As to these compounds, those described in Paragraph Nos. [0018] to [0168] of JP-A-2010-152311 can be used.

The haze of the low refractive index layer is preferably 3% or less, more preferably 2% or less, and most preferably 1% or less.

The strength of the antireflection film in which the low refractive index layer is formed is preferably H or more, more preferably 2H or more, and most preferably 3H or more in a pencil hardness test under a load of 500 g.

Also, in order to improve the antifouling performance of the antireflection film, the contact angle of the surface with water is preferably 90° or more. The contact angle is more preferably 102° or more. In particular, it is preferred that the contact angle is 105° or more, because the antifouling performance against fingerprints is significantly improved. More preferably, the contact angle with water is 102° or more and the surface free energy is 25 dyne/cm or less, still more preferably, 23 dynes/cm, or less, and even still more preferably 20 dyne/cm or less. Most preferably, the contact angle with water is 105° or more and the surface free energy is 20 dynes/cm or less.

(Formation of Low Refractive Index Layer)

The low refractive index layer is preferably formed by coating a coating composition having dissolved or dispersed therein a fluorine-containing antifouling agent having a polymerizable unsaturated group, a fluorine-containing copolymer having a polymerizable unsaturated group, an inorganic fine particle and other optional components contained, if desired, and simultaneously with the coating or after the coating and drying, curing the coating by a cross-linking reaction or polymerization reaction with irradiation of ionized radiation (for example, light irradiation or electron beam irradiation) or heating.

(Curing Condition)

In the case where the hardcoat layer and/or antireflection layer is formed by a crosslinking reaction or polymerization reaction of an ionized radiation curable compound, the crosslinking reaction or polymerization reaction is preferably performed in an atmosphere having an oxygen concentration of 10% by volume or less. By forming the layer in an atmosphere having an oxygen concentration of 10% by volume or less, a cured layer excellent in physical strength and chemical resistance can be obtained.

The oxygen concentration is preferably 1.0% by volume or less, more preferably 0.1% by volume or less, particularly preferably 0.05% by volume or less, and most preferably 0.02% by volume or less.

As a means of controlling the oxygen concentration to 10% by volume or less, replacement of the air (nitrogen concentration is about 79% by volume and oxygen concentration is about 21% by volume) with other gas is preferred, and replacement with nitrogen (nitrogen purging) is particularly preferred.

(Ultraviolet Absorber)

The circular polarizing plate according to the invention may have a surface film. A hardcoat layer and/or antireflection layer of the surface film may contain an ultraviolet absorber. As the ultraviolet absorber, any known ultraviolet absorber which exhibits an ultraviolet absorbing property may be used. Of the ultraviolet absorbers, a benzotriazole ultraviolet absorber or hydroxyphenyltriazine ultraviolet absorber is preferred, in order to obtain a high ultraviolet absorbing property and an ultraviolet absorbing ability (ultraviolet blocking ability) which is used in an electronic image display device. Further, two or more ultraviolet absorbers having different maximum absorption wavelengths may be used in combination in order to widen the ultraviolet absorption band.

Examples of the benzotriazole ultraviolet absorber include 2-[2'-hydroxy-5'-(methacryloyloxymethyl)phenyl]-2H-benzotriazole, 2-[2'-hydroxy-5'-(methacryloxyloxy-ethyl)phenyl]-2H-benzotriazole, 2-[2'-hydroxy-5'-(methacryloyloxypropyl)phenyl]-2H-benzotriazole, 2-[2'-hydroxy-5'-(methacryloyloxyhexyl)phenyl]-2H-benzotriazole, 2-[2'-hydroxy-3'-tert-butyl-5'-(methacryloyloxyethyl)phenyl]-2H-benzotriazole, 2-[2'-hydroxy-5'-tert-butyl-3'-(methacryloyloxyethyl)phenyl]-2H-benzotriazole, 2-[2'-hydroxy-5'-(methacryloyloxyethyl)phenyl]-5-chloro-2H-benzotriazole, 2-[2'-hydroxy-5'-(methacryloxyloxyethyl)phenyl]-5-methoxy-2H-benzotriazole, 2-[2'-hydroxy-5'-(methacryloyloxyethyl)phenyl]-5-cyano-2H-benzotriazole, 2-[2'-hydroxy-5'-(methacryloyloxyethyl)phenyl]-5-tert-butyl-2H-benzotriazole, 2-[2'-hydroxy-5'-(methacryloyloxyethyl)phenyl]-5-nitro-2H-benzotriazole, 2-(2-hydroxy-5-tert-butylphenyl)-2H-benzotriazole, benzenepropanoic acid-3-(2H-benzotriazol-2-yl)-5-(1,1-dimethylethyl)-4-hydroxy-, C7- to 9-branched or straight chain alkyl ester, 2-(2H-benzotriazol-2-yl)-4,6-bis(1-methyl-1-phenylethyl)phenol and 2-(2H-benzotriazol-2-yl)-6-(1-methyl-1-phenylethyl)-4-(1,1,3,3-tetramethylbutyl)phenol.

Examples of the hydroxyphenyltriazine ultraviolet absorber include 2-[4-[(2-hydroxy-3-dodecyloxypropyl)oxy]-2-hydroxyphenyl]-4,6-bis(2,4-dimethylphenyl)-1,3,5-triazine, 2-[4-(2-hydroxy-3-tridecyloxypropyl)oxy]-2-hydroxyphenyl]-4,6-bis (2,4-dimethylphenyl)-1,3,5-triazine, 2-[4-[(2-hydroxy-3-(2'-ethyl)hexyl)oxy]-2-hydroxyphenyl]-4,6-bis(2,4-dimethylphenyl)-1,3,5-triazine, 2,4-bis(2-hydroxy-4-butyloxyphenyl)-6-(2,4-bis-butyloxyphenyl)-1,3,5-triazine, 2-(2-hydroxy-4-[1-octyloxycarbonylethoxy]phenyl)-4,6-bis(4-phenylphenyl)-1,3,5-triazine, 2,2',4,4'-tetrahydroxybenzophenone, 2,2'dihydroxy-4,4'-dimethoxybenzophenone, 2,2'-dihydroxy-4-methoxybenzophenone, 2,4-dihydroxybenzophenone, 2-hydroxy-4-acetoxyethyoxybenzophenone, 2-hydroxy-4-methoxybenzophenone, 2,2'-dihydroxy-4-methoxybenzophenone, 2,2'-dihydroxy-4,4'-dimethoxybenzophenone, 2-hydroxy-4-n-octoxybenzophenone and 2,2'-dihydroxy-4,4'-dimethoxy-5,5'-disulfobenzophenone disodium salt.

The content of the ultraviolet absorber may varied depending on the required ultraviolet transmittance or absorbance of the ultraviolet absorber, and it is ordinarily 20 parts by weight or less, preferably from 1 to 20 parts by weight, based on 100 parts by weight of the ultraviolet curable resin. When the content of the ultraviolet absorber is more than 20 parts by weight, there is a tendency that the curability of the curable composition by ultraviolet ray is reduced, and at the same time, there is a concern that the visible light transmittance of the optical film may be reduced. On the other hand, when the content of the ultraviolet absorber is less than 1 part by weight, the ultraviolet absorbing property of the optical film may not be sufficiently exhibited.

<<Organic Electroluminescence Display Device>>

The organic electroluminescence display device according to the invention is a display device in which a light emitting layer or a plurality of organic compound thin layers including a light emitting layer is formed between a pair of electrodes composed of an anode and a cathode, and may have a hole injection layer, a hole transport layer, an electron injection layer, an electron transport layer, a protective layer and the like in addition to the light emitting layer. Each of these layers may have other function. Various materials can be used for forming each layer.

The anode supplies holes to a hole injection layer, a hole transport layer, a light emitting layer or the like, and a metal, an alloy, a metal oxide, an electrically conductive compound or a mixture thereof can be used therefor, and a material having a work function of 4 eV or more is preferably used. Specific examples of the material include an electrically conductive metal oxide, for example, tin oxide, zinc oxide, indium oxide or indium tin oxide (ITO), a metal, for example, gold, silver, chromium or nickel, a mixture or stack of the metal and the electrically conductive metal oxide, an inorganic electrically conductive material, for example, copper iodide or copper sulfide, an organic electrically conductive material, for example, polyaniline, polythiophene or polypyrrole, and a stack of these materials and ITO. The electrically conductive metal oxide is preferred, and ITO is particularly preferred in view of productivity, high conductivity, transparency and the like. The film thickness of the anode can be appropriately selected according to the material used, and is preferably in a range from 10 nm to 5 μm, more preferably from 50 nm to 1 μm, and still more preferably from 100 to 500 nm.

A substrate is not particularly limited, and is preferably transparent or translucent, and ordinarily, on a substrate, for example, a soda-lime glass, an alkali-free glass or a transparent resin is formed the anode. In the case of using glass, the alkali-free glass is preferably used as the material in order to decrease dissolution of ions from the glass. Also, in the case of using the soda-lime glass, it is preferred to provide a barrier coat, for example, silica thereon.

The thickness of the substrate is not particularly limited as long as it is sufficient for maintaining the mechanical strength thereof. In an embodiment where a light scattering film is used on the surface of display device, when the thickness of the substrate on the viewing side is large, blurring of letter is apt to occur and thus, a smaller thickness of the substrate is more preferred. The thickness of the substrate on the viewing side is preferably from 0.01 to 0.70 mm, more preferably from 0.02 to 0.50 mm, and particularly preferably from 0.03 to 0.30 mm.

In view of the strength and lifetime of the display device, it can be said to be the most preferred configuration to use a thin substrate (preferably glass) of 0.03 to 0.30 mm on the viewing side. When the substrate is thinner than 0.30 mm, it is more preferred to coat a polymer on at least one of one side surface and edge of the substrate to increase the strength.

According to an embodiment of the invention, it is preferred to use, for example, a gas barrier film in place of a glass substrate as at least the substrate on the viewing side. The gas barrier film is a film comprising a plastic support provided with a gas-impermeable barrier layer. Examples of the gas barrier film include a film vapor-deposited with silicon oxide or aluminum oxide (JP-B-53-12953 (the term "JP-B" as used herein means an "examined Japanese patent publication") and JP-A-58-217344), a film having an organic and inorganic hybrid coating layer (JP-A-2000-323273 and JP-A-2004-25732), a film containing an inorganic stratiform compound (JP-A-2001-205743), a film of stack of inorganic materials (JP-A-2003-206361 and JP-A-2006-263989), a film of stack of organic layer and inorganic layer alternately (JP-A-2007-30387, U.S. Pat. No. 6,413,645 and Affinito et al., *Thin Solid Films*, pages 290 to 291 (1996)), and a film of stack of organic layer and inorganic layer continuously (U.S. Patent Publication No. 2004/0046497). As to the barrier property of the gas barrier film, water vapor permeability at 40° C. and relative humidity of 90% is preferably 0.01 g/m²·day or less, and more preferably 0.001 g/m²·day or less.

In an embodiment where a light scattering film is used on the surface of display device, the light scattering film is stuck on the gas barrier film with an adhesive or the like to use. Also, a light scattering film in which a light scattering layer is directly provided on the gas barrier film may be used as at least a substrate on the viewing side, for example, in place of glass. The configuration has the advantages of compatibility between improvement in the viewing angle dependency and reduction in blurring of letter and of making the display device light and thin.

Various methods are used in the production of the anode according to the materials to be used. For instance, in the case of using ITO, a thin film is formed, for example, by an electron beam method, a sputtering method, a resistance heating vapor deposition method, a chemical reaction method (for example, a sol-gel method) or a method of coating a dispersion of an indium tin oxide. It is possible to reduce the driving voltage or increase the emission efficacy of the display device by washing or other treatment of the anode. For example, in the case of using ITO, an UV-ozone treatment or the like is effective.

The cathode supplies electrons to an electron injection layer, an electron transport layer, a light emitting layer or the like, and the cathode is selected taking into consideration a adhesion property to the layer adjacent to the cathode, for example, an electron injection layer, an electron transport layer, a light emitting layer or the like, an ionization potential, stability and the like. As a material for the cathode, a metal, an alloy, a metal oxide, an electrically conductive compound or a mixture of thereof can be used. Specific examples of the material include an alkali metal (for example, Li, Na or K) or a fluoride thereof, an alkaline earth metal (for example, Mg or Ca) or a fluoride thereof, gold, silver, lead, aluminum, a sodium-potassium alloy or a mixed metal thereof, a lithium-aluminum alloy or a mixed metal thereof, a magnesium-silver alloy or a mixed metal thereof, and a rare earth metal, for example, indium or ytterbium. The material is preferably a material having a work function of 4 eV or less, and more preferably aluminum, a lithium-aluminum alloy or a mixed metal thereof and a magnesium-silver alloy or a mixed metal thereof. The film thickness of the cathode can be appropriately selected according to the material used, and is preferably in a range from 10 nm to 5 μm, more preferably from 50 nm to 1 μm, and still more preferably from 100 nm to 1 μm. For the production of the cathode, a method, for example, an electron beam method, a sputtering method, a resistance heating vapor deposition method and a coating method is used, and a single metal can be vapor-deposited or two or more components can be vapor-deposited at the same time. Further, a plurality of metals can be vapor-deposited at the same time to form an alloy electrode, alternatively an alloy previously prepared can be vapor-deposited.

The sheet resistances of the anode and the cathode are preferably low, and preferably several hundred Ω/□ or less.

The gas barrier film described above may be stuck on the cathode to prevent the penetration of gas and to form a protective film on the surface of display.

The material for the light emitting layer may be any material as long as it can form a layer having a function capable of being injected with holes from the anode, the hole injection layer or the hole transport layer and capable of being injected with electrons from the cathode, the electron injection layer and the electron transport layer when an electric field is applied, a function of transferring the electric charge injected, and a function of providing a site for recombination of the holes and the electrons to effect emission of light. Preferably, the light emitting layer contains the compound according to the invention, and light emitting materials other than the compound according to the invention can also be used. Examples of such material include a benzoxazole derivative, a benzimidazole derivative, a benzothiazole derivative, styrylbenzene derivative, a polyphenyl derivative, a diphenylbutadiene derivative, a tetraphenylbutadiene derivative, a naphthalimide derivative, a coumarin derivative, a perylene derivative, a perinone derivative, an oxadiazole derivative, an aldazine derivative, a pyrralidine derivative, a cyclopentadiene derivative, a bisstyrylanthracene derivative, a quinacridone derivative, a pyrrolopyridine derivative, a thiadiazolopyridine derivative, a cyclopentadiene derivative, a styrylamine derivative, an aromatic dimethylidyne compound, various metal complexes represented by a metal complex of 8-quinolinol derivative and a rare earth metal complex, and a polymer compound, for example, polythiophene, polyphenylene or polyphenylenevinylene. The film thickness of the light emitting layer is not particularly limited, and it is preferably in a range from 1 nm to 5 μm, more preferably from 5 nm to 1 μm, and still more preferably from 10 to 500 nm.

A method for forming the light emitting layer is not particularly limited, and a method, for example, a resistance heating vapor evaporation method, an electron beam method, a sputtering method, a molecular lamination method, a coating method (for example, a spin coating method, a cast coating method or a dip coating) or an LB method is used, and a resistance heating vapor evaporation method or a coating method is preferred.

The material for the hole injection layer or the hole transport layer may be any material as long as it has any one of a function of being injected with holes from the anode, a function of transporting the holes and a function of blocking electrons injected from the cathode. Specific examples of the material include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound, a polysilane compound, a poly(N-vinylcarbazole) derivative, an aniline copolymer, and an electrically conductive high molecular weight oligomer, for example, a thiophene oligomer or polythiophene. The film thickness of the hole injection layer or the hole transport layer is not particularly limited, and it is preferably in a range from 1 nm to 5 μm, more preferably from 5 nm to 1 μm, and still more preferably from 10 to 500 nm. The hole injection layer and the hole transport layer may have a single layer structure of one kind or two or more kinds of the materials described above, or may be a multilayer structure comprising a plurality of layers having the same composition or different compositions.

As a method for forming the hole injection layer or the hole transport layer, a vacuum deposition method, an LB method, or a method of dissolving or dispersing the material for the hole injection layer or the hole transport layer described above in a solvent and coating (for example, a spin coating method, a cast coating method or a dip coating method) is used. In the case of the coating method, the material for the hole injection layer or the hole transport layer can be dissolved or dispersed together with a resin component. Examples of the resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), a hydrocarbon resin, a ketone resin, a phenoxy resin, polyamide, ethyl cellulose, polyvinyl acetate, ABS resin, polyurethane, a melamine resin, an unsaturated polyester resin, an alkyd resin, an epoxy resin and a silicone resin.

The material for the electron injection layer or the electron transport layer may be any material as long as it has any one of a function of being injected with electrons from the cathode, a function of transporting the electrons and a function of blocking holes injected from the anode. Specific examples of the material include various metal complexes represented by metal complexes of a triazole derivative, an oxazole derivative, an oxadiazole derivative, a fluorenone derivative, an anthraquinodimethane derivative, an enthrone derivative, a diphenylquinone derivative, a thiopyrandioxide derivative, a carbodiimide derivative, a fluorenylidenemethane derivative, a distyrylpyrazine derivative, a heterocyclic tetracarboxylic acid anhydride, for example, naphthaleneperylene, a phthalocyanine derivatives and a 8-quinolinol derivative, and metal complexes having a ligand, for example, metallophthalocyanine, benzoxazole or benzothiazole. The film thickness of the electron injection layer or the electron transport layer is not particularly limited, and it is preferably in a range from 1 nm to 5 μm, more preferably from 5 nm to 1 μm, and still more preferably from 10 to 500 nm. The electron injection layer and the electron transport layer may be a single layer structure of one kind or two or more kinds of the materials described above, or may be a multilayer structure comprising a plurality of layers having the same composition or different compositions.

As a method for forming the electron injection layer and the electron transport layer, a vacuum evaporation method, an LB method, or a method of dissolving or dispersing the material for the electron injection layer or the electron transport layer described above in a solvent and coating (for example, a spin coating method, a cast coating method or a dip coating method) is used. In the case of the coating method, the material for the electron injection layer or the electron transport layer can be dissolved or dispersed together with a resin component. As the resin component, for example, those described in the hole injection layer and the hole transport layer can be applied.

The material for the protective layer may be any material as long as it has a function of preventing a substance which accelerates deterioration of the display device, for example, water or oxygen, from invading into the display device. Specific examples thereof include a metal, for example, In, Sn, Pb, Au, Cu, Ag, Al, Ti or Ni, a metal oxide, for example, MgO, SiO, $SiO_2$, $Al_2O_3$, GeO, NiO, CaO, BaO, $Fe_2O_3$, $Y_2O_3$ or $TiO_2$, a metal fluoride, for example, $MgF_2$, LiF, $AlF_3$ or $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerization of a monomer mixture containing tetrafluoroethylene and at least one comonomer, a fluorine-containing copolymer having cyclic structure on the main chain, a water-absorbing substance having a water absorption coefficient of 1% or more, and a moisture-proof substance having a water absorption coefficient of 0.1% or less.

A method for forming the protective layer is also not particularly limited and, for example, a vacuum evaporation method, a sputtering method, a reactive sputtering method, an MBE (molecular beam epitaxy) method, a cluster ion beam method, an ion-plating method, a plasma polymerization method (high frequency excited ion plating method), a plasma CVD method, a laser CVD method, a heat CVD method, a gas source CVD method or a coating method can be used.

EXAMPLES

The features of the invention will be described in more detail with reference to the examples and comparative examples below. The materials, amounts of use, proportions, contents of treatments, treating procedures and the like can be appropriately altered as long as the gist of the invention is not exceeded. Therefore, the scope of the invention should not be construed as being limited to the specific examples described below.

1. Preparation of Films 1 to 9

(1) Preparation of Film 1

<Alkali Saponification Treatment>

A commercially available cellulose acetate support (TD80UL, produced by Fujifilm Corp) was prepared, passed through induction heated rollers at temperature of 60° C. to raise the film surface temperature to 40° C., and then an alkali solution having the composition shown below was coated in an amount of 14 ml/m² on the film using a bar coater, followed by transporting for 10 seconds while heating at 110° C. Subsequently, the film was coated with pure water in an amount of 3 ml/m² using a bar coater. Then, water washing and draining by an air-knife were repeated three times, and the film was dried by transporting in a drying zone at 70° C. for 10 seconds, thereby producing a cellulose acetate transparent support subjected to the alkali saponification treatment.

| Composition of alkali solution (parts by weight) | |
|---|---|
| Potassium hydroxide | 4.7 parts by weight |
| Water | 15.8 parts by weight |
| Isopropanol | 63.7 parts by weight |
| Surfactant | 1.0 part by weight |
| SF-1: $C_{14}H_{29}O(CH_2CH_2O)_{20}H$ | |
| Propylene glycol | 14.8 parts by weight |

<Production of Transparent Support with Rubbing Oriented Film>

A coating solution for rubbing oriented film having the composition shown below was continuously coated on the surface subjected to the saponification treatment of the support produced as above by a wire bar of #8. The coated layer was dried with hot air of 60° C. for 60 seconds and then with hot air of 100° C. for 120 seconds to forma rubbing oriented film. Then, a stripe mask having transmission part of a horizontal stripe width of 364 μm and blocking part of a horizontal stripe width of 364 μm was arranged on the rubbing oriented film and an ultraviolet ray was irradiated using a metal halide lamp having an illuminance of 2.5 mW/cm² in the UV-C region for 4 seconds at room temperature in air to decompose the photo-acid generator and to form an acidic compound, thereby forming an oriented film for first retardation region. Subsequently, a rubbing treatment was performed in one back and forth motion in one direction at 500 rpm while maintaining an angle of 45° to the stripes of the stripe mask to produce a transparent support with rubbing oriented film. The thickness of the oriented film was 0.5 μm. The transportation tension at the mask exposure in the production machine was 150 N/m.

| Composition of coating solution for forming oriented film | |
|---|---|
| Polymer material for oriented film (polyvinyl alcohol: PVA 103, produced by Kuraray Co., Ltd.) | 3.9 parts by weight |
| Photo-acid generator (S-2) | 0.1 parts by weight |
| Methanol | 36 parts by weight |
| Water | 60 parts by weight |

Photo-acid generator (S-2)

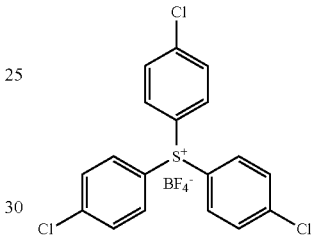

<Production of Patterned Optically Anisotropic Layer>

A coating solution for optically anisotropic layer shown below was coated in an amount of 4 ml/m² using a bar coater. The coating was heated at a film surface temperature of 110° C. for 2 minutes to ripen, cooled to 80° C., and irradiated with an ultraviolet ray for 20 seconds using an UV metal halide lamp of 20 mW/cm² in air to fix the orientation state, thereby forming a patterned optically anisotropic layer. In the mask exposure part (first retardation region), the discotic liquid crystal was vertically oriented with the slow axis direction parallel to the rubbing direction, and in the unexposed part (second retardation region), the discotic liquid crystal was vertically oriented with the slow axis direction orthogonal to the rubbing direction. The thickness of the optically anisotropic layer was 0.9 μm.

| Composition of coating solution for optically anisotropic layer | |
|---|---|
| Discotic liquid crystal E-1 | 100 parts by weight |
| Oriented film interface orientation agent (II-1) | 3.0 parts by weight |
| Air interface orientation agent (P-1) | 0.4 parts by weight |
| Photopolymerization initiator (IRGACURE 907, produed by Ciba Specialty Chemicals Corp.) | 3.0 parts by weight |
| Sensitizer (KAYACURE DETX, produced by Nippon Kayaku Co., Ltd.) | 1.0 part by weight |
| Methyl ethyl ketone | 400 parts by weight |

Discotic liquid crystal E-1

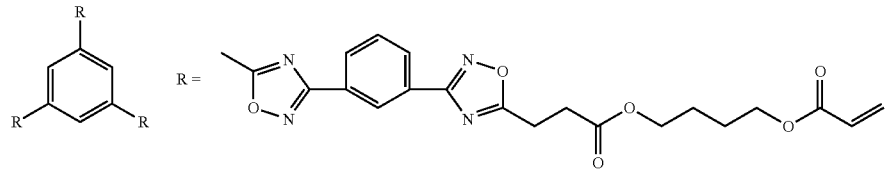

| Composition of coating solution for optically anisotropic layer |
|---|

Oriented film interface orientation agent (II-1)

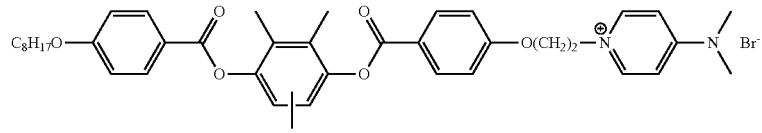

Air interface orientation agent (P-1)

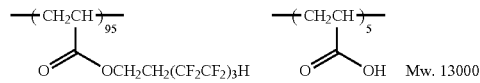

(2) Preparation of Film 2

<Production of Transparent Support a with Light-Oriented Film>

Figure 5:
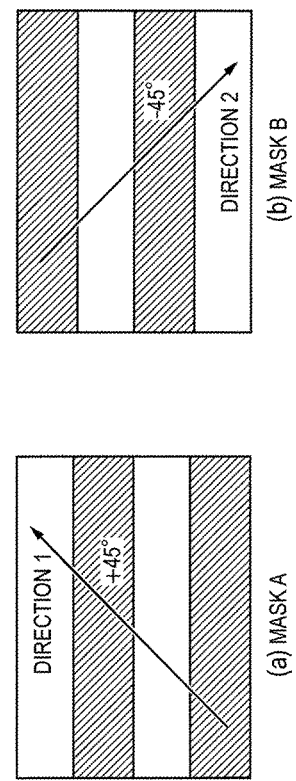
FIG. 5 is a view showing a wire grid polarizer used for preparing film 2

A commercially available cellulose acetate film (Z-TAC, produced by Fujifilm Corp.) was prepared and subjected to the alkali saponification treatment in the same manner as in Example 1. A 1% by weight aqueous solution of Light-oriented material E-1 having the structure shown below was coated on the surface subjected to the saponification treatment of Z-TAC and dried at 100° C. for one minute. An ultraviolet ray was irradiated on the coated film using an air-cooled metal halide lamp of 160 W/cm$^2$ (produced by Eye Graphics Co., Ltd.) in air. At this time, the exposure was performed by setting a wire grid polarizer (ProFlux PPL02, produced by Moxtek, Inc.) in Direction 1 as shown in (a) of FIG. 5 and through Mask A (stripe mask having transmission part of a horizontal stripe width of 364 μm and blocking part of a horizontal stripe width of 364 μm). Thereafter, the exposure was performed by setting the wire grid polarizer in Direction 2 as shown in (b) of FIG. 5 and through Mask B (stripe mask having transmission part of a horizontal stripe width of 364 μm and blocking part of a horizontal stripe width of 364 μm). The distance between the exposure mask face and the light oriented film was set to 200 μm. The illuminance of the ultraviolet ray used at this time was set 100 mW/cm$^2$ in the UV-A region (integration of wavelength range from 320 to 380 nm) and the irradiation amount was set 1,000 mJ/cm$^2$ in the UV-A region.

E-1

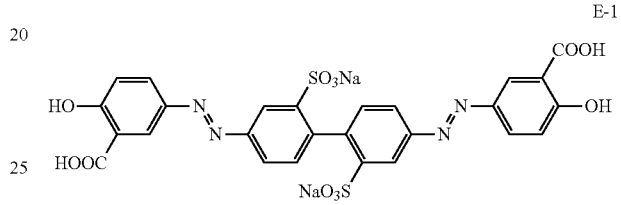

<Production of Patterned Optically Anisotropic Layer>

A composition for optically anisotropic layer shown below was prepared and filtered through a polypropylene filter having a pore diameter of 0.2 μm to use a coating solution. The coating solution was coated on Transparent support A with light-oriented film, dried at a film surface temperature of 105° C. for 2 minutes to form a liquid crystal phase state, cooled to 75° C., and irradiated with an ultraviolet ray using an air-cooled metal halide lamp of 160 W/cm$^2$ (produced by Eye Graphics Co., Ltd.) in air to fix the orientation state, thereby forming a patterned optically anisotropic layer on TD80UL. The thickness of the optically anisotropic layer was 1.2 μm.

| Composition for optically anisotropic layer | |
|---|---|
| Rod-like liquid crystal (LC242, produced by BASF SE) | 100 parts by weight |
| Horizontal orientation agent A | 0.3 parts by weight |
| Photopolymerization initiator (IRGACURE 907, produced by Ciba Specialty Chemicals Corp.) | 3.3 parts by weight |
| Sensitizer (KAYACURE DETX, produced by Nippon Kayaku Co., Ltd.) | 1.1 parts by weight |
| Methyl ethyl ketone | 300 parts by weight |

Rod-like liquid crystal LC242: Rod-like liquid crystal described in WO 2010/090429

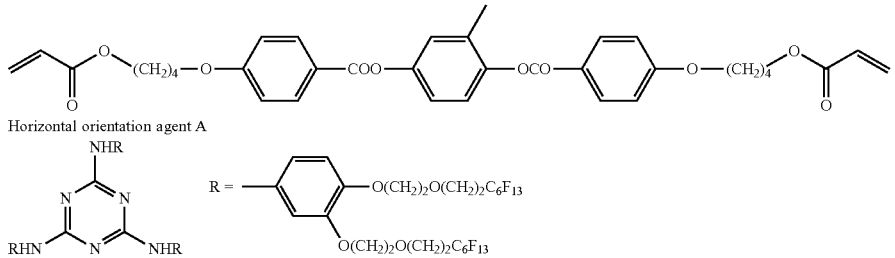

(3) Preparation of Film 3

Film 3 was produced in the same manner as in the production method of Film 1 except for appropriately adjusting the kind of wire bar at the formation of the optically anisotropic layer and the amount of methyl ethyl ketone in the coating solution in the production of Film 1. The thickness of the optically anisotropic layer was 1.01 μm.

(4) Preparation of Film 4

A patterned optically anisotropic layer was produced in the same manner as in the production of Film 3 except for changing the coating solution for optically anisotropic layer in the production of Film 3 to a coating solution having the composition shown below. The thickness of the optically anisotropic layer was 1.77 μm.

| Composition of Cellulose acylate solution A | |
|---|---|
| Cellulose acetate having substitution degree of 2.86 | 100 parts by weight |
| Triphenyl phosphate (plasticizer) | 7.8 parts by weight |
| Biphenyl diphenyl phosphate (plasticizer) | 3.9 parts by weight |
| Methylene chloride (first solvent) | 300 parts by weight |
| Methanol (second solvent) | 54 parts by weight |
| 1-Butanol | 11 parts by weight |

| Composition of coating solution for optically anisotropic layer | |
|---|---|
| Discotic liquid crystal E-3 | 100 parts by weight |
| Oriented film interface orientation agent (II-1) | 1.0 part by weight |
| Air interface orientation agent (P-1) | 0.3 parts by weight |
| Photopolymerization initiator (IRGACURE 907, produced by Ciba Specialty Chemicals Corp.) | 3.0 parts by weight |
| Sensitizer (KAYACURE DETX, produced by Nippon Kayaku Co., Ltd.) | 1.0 part by weight |
| Ethylene oxide-modified trimethylolpropane triacrylate (V#360, produced by Osaka Organic Chemical Industry Ltd.) | 9.9 parts by weight |
| Methyl ethyl ketone | 400 parts by weight |

Discotic liquid crystal E-3

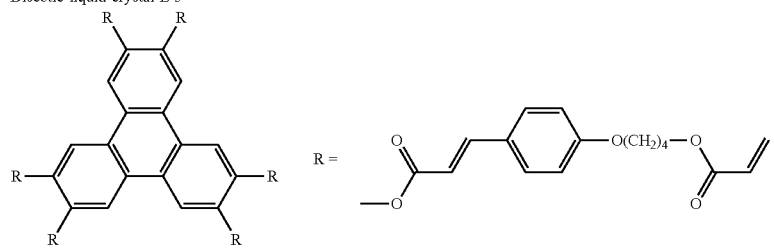

(5) Preparation of Film 5
<Production of Cellulose Acylate Film T1>

A cellulose acylate solution (dope) having the composition shown below was prepared.

| Methylene chloride | 435 parts by weight |
|---|---|
| Methanol | 65 parts by weight |
| Cellulose acylate benzoate (CBZ) (acetyl substitution degree: 2.45, benzoyl substitution degree: 0.55, weight average molecular weight: 180,000) | 100 parts by weight |
| Silicon dioxide fine particle (average particle size: 20 nm, Mohs hardness: about 7) | 0.25 parts by weight |

The dope obtained was cast on a film-forming band, dried at room temperature for one minute and then at 45° C. for 5 minutes. The solvent remaining amount after the drying was 30% by weight. The cellulose acylate film was peeled from the band and dried at 100° C. for 10 minutes and then at 130° C. for 20 minutes to obtain Cellulose acylate film T1. The solvent remaining amount was 0.1% by weight. The thickness, Re(550) and Rth (550) of Cellulose acylate film T1 were 45 μm, 0 nm and −75 nm, respectively.
<Production of Patterned Optically Anisotropic Layer>

A patterned optically anisotropic layer was produced in the same procedure as in the production of Film 3 except for changing TD80UL in the production of Film 3 to Cellulose acylate film T1. The thickness of the optically anisotropic layer was 1.01 μm.
(6) Preparation of Film 6
<Production of Cellulose acylate film T2>

The composition shown below was put into a mixing tank and stirred with heating to dissolve each component, thereby preparing Cellulose acylate solution A.

The composition shown below was put into another mixing tank and stirred with heating to dissolve each component, thereby preparing Additive solution B.

| Composition of Additive solution B | |
|---|---|
| Compound B1 shown below (Re decreasing agent) | 25 parts by weight |
| Compound B2 shown below (wavelength dispersion controlling agent) | 4 parts by weight |
| Methylene chloride (first solvent) | 80 parts by weight |
| Methanol (second solvent) | 20 parts by weight |

Compound B-1

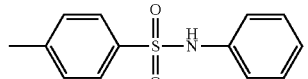

Compound B-2

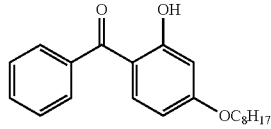

To 477 parts by weight of Cellulose acylate solution A was added 30 parts by weight of Additive solution B, followed by thoroughly stirring to prepare a dope. The dope was cast from a casting outlet on a drum cooled at 0° C. The film was peed from the drum in a state where the solvent content ratio was 70% by weight, both ends of the film in the width direction were fixed by a pin tenter (pin tenter described in FIG. 3 of JP-A-4-1009), and the film was dried while maintaining an interval such that the stretching rate in the lateral direction (direction vertical to the machine direction) was 3% in a state where the solvent content ratio was from 3 to 5% by weight. Then, the film was further dried by being transported between rollers of a heat treatment device to produce Cellulose acetate film T2 having a thickness of 60 µm. The Re(550) and Rth(550) of Cellulose acylate film T2 were 0 nm and 20 nm, respectively.

according to the method described above. The results are shown in Table 1. In the table below, the term "vertical" denotes a tilt angle from 70 to 90° and the term "horizontal" denotes a tilt angle from 0 to 20°. The tilt angles were same at the oriented film interface and at the air interface. Since Film 8 and 9 are not the patterned retardation layers, but the films having a uniform slow axis, the optical characteristic values are collectively shown in the column of Region 1

The measurement results are shown in Table 1 below.

TABLE 1

|  | Re(550) (nm) | | Rth(550) (nm) | | Direction of Slow Axis to Stripe (degree) | | Tilt Angle | | Re Wavelength Dispersity | |
|---|---|---|---|---|---|---|---|---|---|---|
|  | Region 1 | Region 2 | Region 1 | Region 2 | Region 1 | Region 2 | Region 1 | Region 2 | Re(450) > Re(550) > Re(630) | Re(450)/Re(550) |
| Film 1 | 125 | 125 | −10 | −10 | −45 | 45 | Vertical | Vertical | Yes | 1.09 |
| Film 2 | 125 | 125 | 61 | 61 | −45 | 45 | Horizontal | Horizontal | Yes | 1.09 |
| Film 3 | 140 | 140 | −18 | −18 | −45 | 45 | Vertical | Vertical | Yes | 1.09 |
| Film 4 | 140 | 140 | −18 | −18 | −45 | 45 | Vertical | Vertical | Yes | 1.15 |
| Film 5 | 140 | 140 | −90 | −90 | −45 | 45 | Vertical | Vertical | Yes | 1.09 |
| Film 6 | 140 | 140 | 90 | 90 | −45 | 45 | Horizontal | Horizontal | Yes | 1.09 |
| Film 7 | 144 | 140 | −18 | −18 | −47 | 45 | Vertical | Vertical | Yes | 1.09 |
| Film 8 | 142 | — | 71 | — | −45 | — | — | — | No | 0.90 |
| Film 9 | 140 | — | −18 | — | −45 | — | Vertical | — | Yes | 1.09 |

<Production of Patterned Optically Anisotropic Layer>

Film 6 was produced in the same manner as in the production method of Film 2 except for changing Z-TAC to Cellulose acylate film T2 and appropriately adjusting the kind of wire bar at the formation of the optically anisotropic layer and the amount of methyl ethyl ketone in the coating solution in the production of Film 2. The thickness of the optically anisotropic layer was 1.35 µm.

(7) Preparation of Film 7

Film 7 was produced in the same manner as in the production method of Film 3 except for appropriately adjusting the kind of wire bar and the drying condition at the formation of the optically anisotropic layer in the production of Film 3. The thickness of the optically anisotropic layer was 1.01 µm.

(8) Preparation of Film 8

A polycarbonate λ/4 film used in a commercially available organic EL-TV (15EL9500, produced by LG Electronics Inc.) was used as Film 8.

(9) Preparation of Film 9

Film 9 was produced in the same manner as in the production method of Film 3 except for changing the pattern mask exposure after the formation of oriented film in the production of Film 3 to whole surface exposure. The thickness of the optically anisotropic layer was 1.01 µm.

2. Characteristics of Films 1 to 9

(1) Re and Rth of film

The characteristics of Films 1 to 9 produced were collectively shown in the table below. The Re(550) and Rth(550) of each film were measured by KOBRA21-ADH (produced by Oji Scientific Instruments Co., Ltd.) at a wavelength of 550 nm using a 30 mm×40 mm sample of each film subjected to humidity conditioning at 25° C. and 60% RH for 2 weeks. Also, as to Films 1 to 7 and 9, a tilt angle of the discotic liquid crystal at the oriented film interface, a tilt angle of the discotic liquid crystal at the air interface and a direction of the slow axis were measured, respectively, 3. Production of Polarizing Plate A polyvinyl alcohol (PVA) film having a thickness of 80 µm was immersed in an aqueous solution of iodine having an iodine concentration of 0.05% by weight at 30° C. for 60 seconds to dye, vertically stretched 5 times of the original length while immersing in an aqueous solution of boric acid having an boric acid concentration of 4% by weight for 60 seconds, and dried at 50° C. for 4 minutes to obtain a polarizing film having a thickness of 20 µm.

Each of Films 1 to 7 and 9 shown in the table above was immersed in a 1.5 mole/liter aqueous solution of sodium hydroxide at 55° C., and the sodium hydroxide was thoroughly removed by washing with water. Then, the film was immersed in a 0.005 mole/liter aqueous solution of diluted sulfuric acid at 35° C. for one minute and immersed in water to thoroughly wash away the aqueous solution of diluted sulfuric acid. Finally, the film was thoroughly dried at 120° C. Any one sheet of Films 1 to 7 and 9 and a film of TD80UL (produced by Fujifilm Corp.) were stuck using a polyvinyl alcohol adhesive in such a manner that the polarizing film was sandwiched therebetween to produce a circular polarizing plate having the combination shown in Table below. As to film 8, a circular polarizing plate was produced using an acrylic adhesive. As to Films 1 to 7, the polarizing film was stuck so that the absorption axis of the polarizing film was orthogonal to the periodical direction of the patterned retardation layer of each of Films 1 to 7.

4. Installation in Organic EL Element and Evaluation of Display Performance (Installation in Display Device)

A circular polarizing plate stuck on the viewing side of a commercially available organic EL-TV (15EL9500, produced by LG Electronics Inc.) was peeled off, and the circular polarizing plate according to the invention was stuck in a manner as shown in the table below to produce a display device.

(Evaluation of Display Performance)

As to the organic EL display device, the visibility and display quality under indoor bright light were evaluated.

(1) Visibility Under Bright Light

White display, black display and image display were made on the display device, and reflected light due to the backlight reflections of a fluorescent lamp was observed from the front to a polar angle of 45 degree with respect to the absorption axis direction of the polarizing plate. The display quality in an oblique direction in comparison with that of the front was evaluated according to the criteria shown below.

A: Coloration of the reflected light is not visually recognized at all (Acceptable).
B: Coloration of the reflected light is visually recognized very slightly, but it has practically no problem (Acceptable).
C: Coloration of the reflected light is visually recognized strongly and it is not acceptable.

The evaluation results are shown in Tables 2 and 3.

It can be seen that Examples 1 to 7 of the organic EL display device according to the invention exhibit less coloration of reflected light under bright light than Comparative Examples 1 and 2 having a conventional circular polarizing plate and are excellent in the visibility. In particular, in Comparative Example 1, which is an embodiment having a λ/4 film of Re reverse wavelength dispersibility, green reflected color is slightly observed so that the display quality is not preferred. Specifically, by the patterning of λ/4 film of Re order dispersibility, which has been considered to be not suitable to use as a circular polarizing plate for organic EL element, the reflected colors of the two regions are combined, so that a circular polarizing plate having extremely small coloration of reflected light can be produced. According to a conventional oblique stretching and coating of liquid crystal, Re becomes flat dispersion or order dispersion so that the performance is insufficient for the antireflection film for organic EL element. However, according to the invention, by using the patterned retardation layer the circular

TABLE 2

|  |  |  | Example 1 | Example 2 | Example 3 | Example 4 | Example 5 |
|---|---|---|---|---|---|---|---|
| Schematic Drawing of Circular Polarizing Plate | | | POL TD80UL Discotic Liquid Crystal Layer OLED | POL Z-TAC Rod-like Liquid Crystal Layer OLED | POL TD80UL Discotic Liquid Crystal Layer OLED | POL TD80UL Discotic Liquid Crystal Layer OLED | POL Film T1 Discotic Liquid Crystal Layer OLED |
| Circular Polarizing Plate | Polarizing Film | Angle of Absorption Axis (degree) | 90 | 90 | 90 | 90 | 90 |
| | Optical Stack | Re(550) (nm) Region 1/Region 2 | 125/125 | 125/125 | 140/140 | 140/140 | 140/140 |
| | | Rth(550) (nm) Region 1/Region 2 | −10/−10 | 61/61 | −18/−18 | −18/−18 | −90/−90 |
| | | Re Slow Axis (degree) Region 1/Region 2 | 45/135 | 45/135 | 45/135 | 45/135 | 45/135 |
| | | Kind of Film | 1 | 2 | 3 | 4 | 5 |
| | | Re(450) > Re(550) > Re(630) | YES | YES | YES | YES | YES |
| | | Re(450)/Re(550) | 1.09 | 1.09 | 1.09 | 1.15 | 1.09 |
| | | −90 ≤ Rth(550) ≤ 90 | YES | YES | YES | YES | YES |
| Coloration of Reflected Light | | | A | B | A | A | B |

TABLE 3

|  |  |  | Example 6 | Example 7 | Comparative Example 1 | Comparative Example 2 |
|---|---|---|---|---|---|---|
| Schematic Drawing of Circular Polarizing Plate | | | POL Film T2 Rod-like Liquid Crystal Layer OLED | POL TD80UL Discotic Liquid Crystal Layer OLED | POL Polycarbonate Film OLED | POL TD80UL Discotic Liquid Crystal Layer OLED |
| Circular Polarizing Plate | Polarizing Film | Angle of Absorption Axis (degree) | 90 | 90 | 90 | 90 |
| | Optical Stack | Re(550) (nm) Region 1/Region 2 | 140/140 | 144/140 | 142/— | 140/— |
| | | Rth(550) (nm) Region 1/Region 2 | 90/90 | −18/−18 | 71/— | −18/— |
| | | Re Slow Axis (degree) Region 1/Region 2 | 45/135 | 43/135 | 45/— | 45/— |
| | | Kind of Film | 6 | 7 | 8 | 9 |
| | | Re(450) > Re(550) > Re(630) | YES | YES | NO | YES |
| | | Re(450)/Re(550) | 1.09 | 1.09 | 0.90 | 1.09 |
| | | −90 ≤ Rth(550) ≤ 90 | YES | YES | YES | YES |
| Coloration of Reflected Light | | | B | A | C | C | polarizing plate is able to be produced in a roll to roll manner, and it is possible to provide the organic EL display device having the excellent antireflection performance in a high yield in addition to in a high productivity and excellent cost-competitiveness.

INDUSTRIAL APPLICABILITY

According to the invention, an organic EL element having a circular polarizing plate, which is improved in the coloration of reflected light can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 5, 2012 (Japanese Patent Application No. 2012-048404), and the contents thereof are incorporated herein by reference.

DESCRIPTION OF REFERENCE NUMERALS AND SIGNS

1 TFT substrate
2 Back electrode
3 Organic layer including light emitting layer
4 Transparent or translucent electrode
5 Transparent substrate
6 Patterned retardation layer
7 Polarizing plate
13 Support film

The invention claimed is:

1. An image display device in which an image display panel, at least one patterned retardation layer and a polarization element layer are arranged in this order, and the patterned retardation layer comprises first retardation regions and second retardation regions which are alternately arranged in a stripe-like form and in which at least one of an in-plane slow axis direction and a retardation is different from each other,
wherein a total Rth of entire layers provided at a side of the polarization element layer, in which the patterned retardation layer is provided, in the first retardation region and the second retardation region of the patterned retardation layer satisfies the following formula (II):

$$-90\ nm \leq Rth(550) \leq 90\ nm \tag{II}$$

wherein $Rth(\lambda)$ represents a retardation (nm) in a thickness direction at a wavelength of $\lambda$ nm.

2. The image display device as claimed in claim 1, wherein at least one of the first retardation region and the second retardation region of the patterned retardation layer has an in-plane retardation of $\lambda/4$.

3. The image display device as claimed in claim 1, wherein the first retardation region and the second retardation region of the patterned retardation layer satisfy the following formula (I):

$$Re(450) > Re(550) > Re(630) \tag{I}$$

wherein $Re(\lambda)$ represents an in-plane retardation (nm) at a wavelength of $\lambda$ nm.

4. The image display device as claimed in claim 2, wherein the first retardation region and the second retardation region of the patterned retardation layer satisfy the following formula (I):

$$Re(450) > Re(550) > Re(630) \tag{I}$$

wherein $Re(\lambda)$ represents an in-plane retardation (nm) at a wavelength of $\lambda$ nm.

5. The image display device as claimed in claim 1, wherein the patterned retardation layer comprises an optically anisotropic layer containing at least an oriented film and a liquid crystal compound.

6. The image display device as claimed in claim 2, wherein the patterned retardation layer comprises an optically anisotropic layer containing at least an oriented film and a liquid crystal compound.

7. The image display device as claimed in claim 3, wherein the patterned retardation layer comprises an optically anisotropic layer containing at least an oriented film and a liquid crystal compound.

8. The image display device as claimed in claim 4, wherein the patterned retardation layer comprises an optically anisotropic layer containing at least an oriented film and a liquid crystal compound.

9. The image display device as claimed in claim 5, wherein the liquid crystal compound contained in the optically anisotropic layer is a discotic liquid crystal compound, and the discotic liquid crystal compound is oriented approximately vertically.

10. The image display device as claimed in claim 6, wherein the liquid crystal compound contained in the optically anisotropic layer is a discotic liquid crystal compound, and the discotic liquid crystal compound is oriented approximately vertically.

11. The image display device as claimed in claim 7, wherein the liquid crystal compound contained in the optically anisotropic layer is a discotic liquid crystal compound, and the discotic liquid crystal compound is oriented approximately vertically.

12. The image display device as claimed in claim 8, wherein the liquid crystal compound contained in the optically anisotropic layer is a discotic liquid crystal compound, and the discotic liquid crystal compound is oriented approximately vertically.

13. The image display device as claimed in claim 1, wherein the liquid crystal compound contained in the optically anisotropic layer is a discotic liquid crystal compound, and the discotic liquid crystal compound is oriented approximately vertically.

14. The image display device as claimed in claim 2, wherein the liquid crystal compound contained in the optically anisotropic layer is a discotic liquid crystal compound, and the discotic liquid crystal compound is oriented approximately vertically.

15. The image display device as claimed in claim 3, wherein the liquid crystal compound contained in the optically anisotropic layer is a discotic liquid crystal compound, and the discotic liquid crystal compound is oriented approximately vertically.

16. The image display device as claimed in claim 1, wherein the image display panel is an organic EL element.

* * * * *